US012703126B2

(12) United States Patent
Maesowa et al.

(10) Patent No.: US 12,703,126 B2
(45) Date of Patent: Aug. 11, 2026

(54) MOLD RELEASE FILM

(71) Applicant: SUMITOMO BAKELITE CO., LTD., Tokyo (JP)

(72) Inventors: Shinichi Maesowa, Tokyo (JP); Jun Okada, Tokyo (JP); Motoki Sato, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 250 days.

(21) Appl. No.: 18/271,309

(22) PCT Filed: Dec. 13, 2021

(86) PCT No.: PCT/JP2021/045778
§ 371 (c)(1),
(2) Date: Jul. 7, 2023

(87) PCT Pub. No.: WO2022/153756
PCT Pub. Date: Jul. 21, 2022

(65) Prior Publication Data

US 2024/0075656 A1 Mar. 7, 2024

(30) Foreign Application Priority Data

Jan. 14, 2021 (JP) ................................ 2021-004017
Jan. 14, 2021 (JP) ................................ 2021-004041
May 28, 2021 (JP) ................................ 2021-090120

(51) Int. Cl.
*B32B 15/04* (2006.01)
*B29C 33/68* (2006.01)
(Continued)

(52) U.S. Cl.
CPC .............. *B29C 33/68* (2013.01); *B29C 43/18* (2013.01); *H10W 74/017* (2026.01); *B29C 2043/181* (2013.01); *B29L 2031/3406* (2013.01)

(58) Field of Classification Search
CPC .............................. B29C 33/68; H01L 21/566
(Continued)

(56) References Cited

U.S. PATENT DOCUMENTS 10,913,183 B2 2/2021 Kasai
11,373,881 B2 * 6/2022 Shoji ....................... B32B 27/28
(Continued)

FOREIGN PATENT DOCUMENTS

JP 2010-209208 A 9/2010
JP 2014-113703 A 6/2014
(Continued)

OTHER PUBLICATIONS

International Search Report dated Mar. 8, 2022, issued in counterpart International Application No. PCT/JP2021/045778 (2 pages).
(Continued)

*Primary Examiner* — Lauren R Colgan
(74) *Attorney, Agent, or Firm* — WHDA, LLP

(57) ABSTRACT

The mold release film has a multilayer structure in which a mold release layer, a first base material layer, and a second base material layer are laminated. The mold release layer constitutes a mold release surface, and the second base material layer constitutes a surface of the mold release film on an opposite side of the mold release surface. The mold release layer contains one or two or more selected from a silicone resin, a fluororesin, a melamine resin, an epoxy resin, and a phenolic resin. The first base material layer is formed by a stretched or un-stretched film containing one or two or more selected from a polyester resin, a polyolefin
(Continued)

resin, and a polyamide resin. The second base material layer is formed by a stretched or un-stretched film containing one or two or more selected from a polyester resin, a polyolefin resin, and a polyamide resin.

7 Claims, 1 Drawing Sheet

(51) Int. Cl.
*B29C 43/18* (2006.01)
*B32B 17/06* (2006.01)
*H10W 74/01* (2026.01)
*B29L 31/34* (2006.01)
(58) Field of Classification Search
USPC .......................................................... 428/410
See application file for complete search history.

(56) References Cited

U.S. PATENT DOCUMENTS

| | | | | |
|---|---|---|---|---|
| 2009/0053528 | A1* | 2/2009 | Okuya | B29C 33/68 428/421 |
| 2016/0200007 | A1* | 7/2016 | Kasamatsu | B29C 33/58 428/421 |
| 2016/0368176 | A1 | 12/2016 | Kasai | |
| 2017/0157803 | A1* | 6/2017 | Kuma | B32B 27/20 |
| 2017/0207105 | A1* | 7/2017 | Kasai | B29C 70/70 |
| 2019/0275763 | A1* | 9/2019 | Suzuki | B32B 27/00 |
| 2020/0335360 | A1* | 10/2020 | Shoji | B32B 27/281 |
| 2022/0152882 | A1* | 5/2022 | Sakai | B29C 45/02 |

FOREIGN PATENT DOCUMENTS

| | | | |
|---|---|---|---|
| JP | 2014-212239 | A | 11/2014 |
| JP | 2014-213576 | A | 11/2014 |
| JP | 2016-92272 | A | 5/2016 |
| JP | 2018-1626 | A | 1/2018 |
| JP | 2018-202834 | A | 12/2018 |
| JP | 2018202834 | * | 12/2018 |
| JP | 2020-19264 | A | 2/2020 |
| JP | 2020-151949 | A | 9/2020 |
| JP | 6-870775 | B1 | 5/2021 |
| KR | 20020047485 | A | 6/2002 |
| KR | 20150008148 | A | 1/2015 |
| KR | 20160130803 | A | 11/2016 |
| KR | 20200100036 | A | 8/2020 |
| SG | 11202106409 | P | 7/2021 |
| TW | 201509666 | A | 3/2015 |
| TW | 202033350 | A | 9/2020 |
| WO | 2020/031708 | A1 | 2/2020 |

OTHER PUBLICATIONS

Office Action dated Feb. 12, 2025, issued in counterpart JP Application No. 2021-090120. (3 pages).

* cited by examiner

MOLD RELEASE FILM

TECHNICAL FIELD

The present invention relates to a mold release film.

BACKGROUND ART

Conventionally, various techniques are under development in the field of mold release films. For example, in the field of manufacturing processes for semiconductor devices, it is known to manufacture a molded body by disposing a mold release film between a metal mold and an object to be molded, and resin-sealing the object to be molded on which electronic components such as semiconductor elements are mounted by means of molding methods such as a transfer mold molding method and a compression mold molding method (for example, Patent Documents 1 to 3). By disposing the mold release film between the metal mold and the object to be molded, a molded body can be easily removed from the metal mold after resin sealing. In addition, such a mold release film used for resin molding using a metal mold is generally called a mold release film for mold molding.

RELATED DOCUMENT

Patent Document

[Patent Document 1] Japanese Laid-Open Patent Publication No. 2020-151949

[Patent Document 2] Japanese Laid-Open Patent Publication No. 2020-19264

[Patent Document 3] Japanese Laid-Open Patent Publication No. 2016-092272

SUMMARY OF THE INVENTION

Technical Problem

However, wrinkles and strain generated on a mold release film may be transferred to the surface of a molded body obtained using the conventional mold release film, and there is room for improvement in obtaining a molded body having a higher level and favorable external appearance.

Solution to Problem

The inventors of the present invention conducted intensive studies on the causes of wrinkles and strain generated on a mold release film, and found that there were the following problems.

Usually, a suction port for evacuation is provided around a cavity recess of a lower metal mold so that a mold release film is vacuum-adhered to the inner surface of the cavity recess. After disposing the mold release film so as to cover both the cavity recess and the suction port around it, the air between the mold release film and the cavity recess is sucked by the suction port and evacuated, and thereby the mold release film can be vacuum-adhered to the inner surface of the cavity recess. At the time of this evacuation, the mold release film is also drawn into the suction port to some extent. When the amount of deformation of the mold release film is not sufficient, some part of the mold release film is drawn into the suction port, which may cause the end part of the mold release film near the suction port to rise up. Due to that, a slight space is generated between the rose end part of the mold release, film and the lower mold, making the suction not be performed sufficiently. Therefore, the adhesiveness of the mold release film to the cavity recess is lowered, and it became clear that wrinkles and the like are likely to be generated on the mold release film.

Furthermore, an upper metal mold holds an object to be molded on which electronic components such as semiconductor elements are mounted. Then, using the lower metal mold in which the cavity recess is filled with a resin material for sealing and the upper metal mold to which the object to be molded is fixed, compression molding is performed by clamping the object to be molded from above and below, thereby obtaining a resin mold. At this time, pressure is applied when raising a pedestal of the lower metal mold to compress the resin material for sealing. At this time, because the depth of the cavity becomes shallow, a slight space is generated between the mold release film and the inner surface of the cavity recess. Therefore, it became clear that deformation occurs in the mold release film, which causes strain and wrinkles.

Therefore, the mold release film disposed on the metal mold is required to have sufficient flexibility and elongation properties to cope with local deformation.

Meanwhile, according to the inventors of the present invention, they found that when attempting to increase the flexibility and elongation of the mold release film, there is a constraint in that the thickness of the mold release film is required to be reduced, but when the film is made thin, the workability tends to, decrease because the film cannot be made sufficiently stiff.

Therefore, the inventors of the present invention made further intensive studies from the viewpoint of achieving both a molded body having a favorable external appearance attributable to a mold release film, and the workability of the mold release film. They found that it is effective to specifically combine the materials of a mold release layer constituting a mold release surface of the mold release film, a second base material layer constituting a surface on the opposite side thereof, and a first base material layer interposed therebetween.

According to the first invention, a mold release film is provided,

- the mold release film having a multilayer structure in which a mold release layer, a first base material layer, and a second base material layer are laminated in this order,
- in which the mold release layer constitutes a mold release surface of the mold release film, and the second base material layer constitutes a surface of the mold release film on an opposite side of the mold release surface,
- the mold release layer contains one or two or more selected from a silicone resin, a fluororesin, a melamine resin, an epoxy resin, a phenolic resin, and an acrylic resin,
- the first base material layer is formed by a stretched or un-stretched film containing one or two or more selected from a polyester resin, a polyolefin resin, and a polyamide resin, and
- the second base material layer is formed by a stretched or un-stretched film containing one or two or more selected from a polyester resin, a polyolefin resin, and a polyamide resin.

In addition, the inventors of the present invention conducted intensive studies on the causes of wrinkles and strain, generated on the mold release film, and found that there were the following problems.

Usually, a suction port for evacuation is provided around a cavity recess of a lower metal mold so that the mold release film is vacuum-adhered to the inner surface of the cavity recess. After disposing the mold release film so as to cover both the cavity recess and the suction port around it, the air between the mold release film and the cavity recess is sucked by the suction port and evacuated, and thereby the mold release film can be vacuum-adhered to the inner surface of the cavity recess. At the time of this evacuation, the mold release film is also drawn into the suction port to some extent. When the amount of deformation of the mold release film is not sufficient, some part of the mold release film is drawn into the suction port, which may cause the end part of the mold release film near the suction port to rise up. Due to that, a slight space is generated between the rose end part of the mold release film and the lower mold, making the suction not be performed sufficiently. Therefore, the adhesiveness of the mold release film to the cavity recess is lowered, and it became clear that wrinkles and the like are likely to be generated on the mold release film.

Furthermore, an upper metal mold holds an object to be molded on which electronic components such as semiconductor elements are mounted. Then, using the lower metal mold in which the cavity recess is filled with a resin material for sealing and the upper metal mold to which the object to be molded is fixed, compression molding is performed by clamping the object to be molded from above and below, thereby obtaining a resin mold. At this time, pressure is applied when raising a pedestal of the lower metal mold to compress the resin material for sealing. At this time, because the depth of the cavity becomes shallow, a slight space is generated between the mold release film and the inner surface of the cavity recess. Therefore, it became clear that deformation occurs in the mold release film, which causes strain and wrinkles.

Therefore, the inventors of the present invention conducted further intensive studies from the viewpoint of solving such problems. They newly devised a ratio of a predetermined tensile strength and a predetermined breaking strength as indexes for controlling the characteristics of the mold release film. Then, they found that by controlling these indexes at the same time, the generation of wrinkles on the mold release film can be prevented when the mold release film returns to its original shape (elastic recovery) after elongation while sufficient elongation (deformation) can be obtained in response to the stress at the time of metal mold fitting. Thereby, the present invention was completed. In addition, they found that by controlling such new indexes, the generation of wrinkles and strain on the mold release film can be effectively prevented without limiting usage in the above-mentioned manufacturing method.

According to the second invention, a mold release film is provided, the mold release film satisfying the following (a) and (b):

(a) a 5% tensile strength (5% modulus) of the mold release film at 180° C. is equal to or more than 1.0 MPa and equal to or less than 5.0 MPa, and (b) $\alpha 1$ is equal to or more than 0.20 and equal to or less than 0.80 when X1 (MPa) is a breaking strength at 25° C., X2 (MPa) is a breaking strength at 180° C., and $(1-(X1-X2)/X1)$ is $\alpha 1$.

The inventors of the present invention conducted intensive studies on the causes of wrinkles and strain generated on the mold release film, and found that there were the following problems.

Usually, a suction port for evacuation is provided around a cavity recess of a lower metal mold so that a mold release film is vacuum-adhered to the inner surface of the cavity recess. After disposing the mold release film so as to cover both the cavity recess and the suction port around it, the air between the mold release film and the cavity recess is sucked by the suction port and evacuated, and thereby the mold release film can be vacuum-adhered to the inner surface of the cavity recess. At the time of this evacuation, the mold release film is also drawn into the suction port to some extent. When the amount of deformation of the mold release film is not sufficient, some part of the mold release film is drawn into the suction port, which may cause the end part of the mold release film near the suction port to rise up. Due to that, a slight space is generated between the rose end part of the mold release film and the lower mold, making the suction not be performed sufficiently. Therefore, the adhesiveness of the mold release film to the cavity recess is lowered, and it became clear that wrinkles and the like are likely to be generated on the mold release film.

Furthermore, an upper metal mold holds an object to be molded on which electronic components such as semiconductor elements are mounted. Then, using the lower metal mold in which the cavity recess is filled with a resin material for sealing and the upper metal mold to which the object to be molded is fixed, compression molding is performed by clamping the object to be molded from above and below, thereby obtaining a resin mold. At this time, pressure is applied when raising a pedestal of the lower metal mold to compress the resin material for sealing. At this time, because the depth of the cavity becomes shallow, a slight space is generated between the mold release film and the inner surface of the cavity recess. Therefore, it became clear that deformation occurs in the mold release film, which causes strain and wrinkles.

Therefore, the inventors of the present invention conducted further intensive studies from the viewpoint of solving such problems. They newly devised two indexes relating to the difference in amounts of dimensional change at a predetermined temperature as indexes for controlling the characteristics of the mold release film by focusing on thermomechanical analysis (TMA) curves under a predetermined condition. Then, they found that by controlling each of these indexes, the generation of wrinkles on the mold release film can be prevented when the mold release film returns to its original shape (elastic recovery) after elongation while sufficient elongation (deformation) can be obtained in response to the stress at the time of metal mold fitting. Thereby, the present invention was completed. In addition, they found that by controlling such new indexes, the generation of wrinkles and strain on the mold release film can be effectively prevented without limiting usage in the above-mentioned manufacturing method.

According to the third invention, a mold release film is provided, the mold release film satisfying the following (a) in a TMA curve obtained from the relationship between the temperature measured by stretching the mold release film under a condition of a temperature rising rate of 2° C./minute and a load of 500 mN, and the amount of dimensional change in the length of the mold release film in thermomechanical analysis (TMA) measurement, (a) $\alpha 1$ is 0.1 to 1.0 when an amount of dimensional change at 170° C. is X1(%), an amount of dimensional change at 190° C. is X2(%), and $(X2-X1)/(190-170)$ is $\alpha 1$.

Furthermore, according to the fourth invention, a mold release film is provided, the mold release film satisfying the following (b) in a TMA curve obtained from the relationship between the temperature measured by stretching the mold release film under a condition of a temperature rising rate of 2° C./minute and a load of 500 mN, and the amount of dimensional change in the length of the mold release film in thermomechanical analysis (TMA) measurement, (b) $\alpha1/\alpha2$ is 6 to 35 when an amount of dimensional change at 170° C. is X1(%), an amount of dimensional change at 190° C. is X2(%), and (X2−X1)/(190−170) is al, and when an amount of dimensional change at 25° C. is X3(%), an amount of dimensional change at 100° C. is X4(%), and (X4−X3)/(100−25) is $\alpha2$.

Advantageous Effects of Invention

According to the present invention, a mold release film from which a molded body having a favorable external appearance is obtained while maintaining a favorable workability of the mold release film is provided.

DESCRIPTION OF EMBODIMENTS

Figure 1:
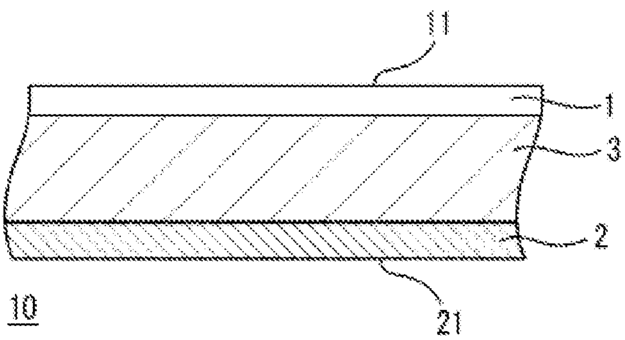
FIG. 1 is a cross-sectional view schematically showing a cross section of a mold release film of the first embodiment.

Hereinafter, embodiments of the present invention will be described in detail with reference to the drawings.

In all the drawings, same components are designated by the same reference numerals, and description thereof will not be repeated. In order to avoid complication, when there are multiple identical components in the same drawing, only one of them may be designated by a reference numeral, not all of them. The drawings are for illustrative purposes only. Shapes, dimensional ratios, and the like of each member in the drawings do not necessarily correspond to actual articles.

In the present specification, the notation "a to b" in the description of a numerical value range represents equal to or more than a and equal to or less than b, unless otherwise specified. For example, "1 to 5 mass %" means "equal to or more than 1 mass % and equal to or less than 5 mass %".

In the present specification, the MD direction represents the machine direction and is intended to mean the flow direction (length direction) at the time of film formation, and the TD direction represents the transverse direction and is intended to mean the vertical direction.

First Embodiment

<Mold Release Film>

FIG. 1 is a cross-sectional view schematically showing a cross section of a mold release film of the first embodiment.

As shown in FIG. 1, the mold release film 10 of the present embodiment has a multilayer structure in which a mold release layer 1, a first base material layer 3, and a second base material layer 2 are laminated in this order. The mold release layer 1 constitutes a mold release surface 11 of the mold release film 10, and the second base material layer 2 constitutes a surface 21 of the mold release film 10 on an opposite side of the mold release surface 11.

In the present embodiment, the mold release film 10 having the three-layer structure in which the mold release layer 1, the first base material layer 3, and the second base material layer 2 are laminated in this order will be described. However, it is sufficient when each of the mold release layer 1 and the second base material layer 2 constitutes the outer surface of the mold release film 10, and a layer other than the first base material layer 3 may be interposed between the mold release layer 1 and the second base material layer 2.

The rate of dimensional change of the mold release film 10 of the present embodiment is preferably 4% to 40% at 180° C., more preferably 5% to 35%, and further preferably 7% to 30% when a temperature is raised from 30° C. to 180° C. at 2° C./minute with a tensile load of 500 mN according to a thermomechanical analysis (TMA).

By setting the rate of dimensional change within the above-mentioned numerical value range, favorable followability to a metal mold when the mold release film 10 is disposed in the metal mold is obtained while maintaining workability, thereby preventing wrinkles and strain of the mold release film 10 from being generated, which makes it possible to prevent wrinkles and strain of the mold release film 10 from being transferred to a molded body. Due to that, it becomes possible to obtain a molded body having a favorable external appearance. In particular, when the mold release film is vacuum-adhered to the inner surface of a cavity recess, and when a suction port of the metal mold is a relatively deep groove, the mold release film 10 is also drawn into the deep groove. Therefore, the mold release film 10 is required to be sufficiently elongated locally, which can be embodied by the mold release film of the present embodiment.

In addition, the storage elastic modulus of the mold release film 10 of the present embodiment is preferably 10 to 500 MPa at 180° C. and is more preferably 70 to 400 MPa when a dynamic viscoelasticity (DMA) is measured under a condition of a temperature rising rate of 5° C./minute and a frequency of 1 Hz.

The storage elastic modulus of the mold release film 10 at 180° C. is intended to mean a storage elastic modulus when the mold release film 10 is disposed in a metal mold and heat-compressed.

By setting the storage elastic modulus of the mold release film 10 at 180° C. within the above-mentioned numerical value range, favorable mold releasability and cushioning properties can be maintained while enhancing metal mold followability at the time of vacuum adhesion.

In addition, a value of the mold release film 10 of the present embodiment measured by a loop stiffness test is preferably equal to or more than 2 mN/cm, more preferably equal to or more than 5 mN/cm, and further preferably equal to or more than 10 mN/cm. Thus, the workability of the film can be improved.

On the other hand, the upper limit value of the value measured by the loop stiffness test is not particularly limited, but for example, it may be equal to or less than 100 mN/cm or may be equal to or less than 80 mN/cm from the viewpoint of maintaining the characteristics as the mold release film.

The rate of dimensional change, the storage elastic modulus, and the loop stiffness of the mold release film 10 of the present embodiment can be embodied by selecting and combining the following known methods, and using an approach different from the conventional methods. The above-mentioned known methods are a film formation method and types of raw materials for the mold release layer 1, the first base material layer 3, and the second base material layer 2, controlling the surface roughness of the mold release film 10, and a manufacturing method of the mold release film 10, for example.

For example, when a film stretches as the film formation method, the film can be made harder and stiffer than an un-stretched film. In addition, for example, the first base material layer 3 is made to have stiffness while setting the surface roughness and tackiness in a predetermined state by controlling the surface state of the mold release surface 11 formed by the mold release layer 1 and the surface 21 formed by the second base material layer 2, both of which constitute the outer surfaces of the mold release film, in order to improve the handleability of the mold release film 10. Furthermore, as an example of the manufacturing method of the mold release film 10 of the present embodiment, a band-shaped laminate of the second base material layer 2 and the first base material layer 3 may be coated with a coating liquid of a first resin composition constituting the mold release layer 1 by a roll-to-roll method. At this time, when at least one of the second base material layer 2 and the first base material layer 3 is an un-stretched film, the tension caused by the roll-to-roll method is likely to be applied to the second base material layer 2 and the first base material layer 3. Therefore, by setting the conveying tension of a roll in the roll-to-roll method to be equal to or less than 100 N, the stress applied to the second base material layer 2 and the first base material layer 3 can be reduced, which makes it possible to obtain a desired mold release film 10.

The thickness of the mold release film 10 is preferably equal to or more than 5 μm and equal to or less than 150 μm, more preferably equal to or more than 10 μm and equal to or less than 100 μm, and further preferably equal to or more than 15 μm and equal to or less than 80 μm.

Details of each of the layers of the mold release film 10 of the present embodiment will be described below.

[Mold Release Layer 1]

In the present embodiment, the mold release layer 1 forms the surface 11 on the one side of the mold release film 10 and is a resin layer constituting the surface on the side that comes into contact with a sealing resin (molded body to be mentioned later) when the mold release film 10 is disposed in a metal mold.

The thickness of the mold release layer 1 is preferably 0.01 to 50 μm, more preferably 0.05 to 30 μm, further preferably 0.08 to 25 μm, and even further preferably 0.1 to 15 μm.

By setting the thickness of the mold release layer 1 to be equal to or more than the above-mentioned lower limit value, the required mold releasability can be imparted to the mold release film 10. On the other hand, by setting the thickness of the mold release layer 1 to be equal to or less than the above-mentioned upper limit value, the rigidity of the mold release film 10 can be controlled, which makes it possible to achieve a favorable balance between mold followability and mold releasability.

In addition, the surface roughness Ra of the surface 11 on the mold release layer 1 side of the mold release film 10 is preferably 0.3 to 2 μm, more preferably 0.4 to 1.5 μm, and further preferably 0.5 to 1.2 μm from the viewpoint of mold releasability and a favorable external appearance the molded body.

By setting the surface roughness Ra of the surface 11 to be equal to or more than the above-mentioned lower limit value, a favorable balance between mold releasability and mold followability at the time of molding can be achieved. On the other hand, by setting the surface roughness Ra of the surface 11 to be equal to or less than the above-mentioned upper limit value, a favorable balance between mold releasability and a favorable external appearance of the molded body can be achieved.

The surface roughness Ra of the surface 11 is preferably less than 0.2 μm from the viewpoint of imparting gloss to the external appearance of the molded body obtained using the mold release film 10.

As a controlling method of the surface roughness of the surface 11 on the mold release layer 1 side, adjustment can be performed by a known method such as transferring an embossed pattern to the film using a roll that has been subjected to embossing processing in the manufacturing step of the mold release film, or blending particles into the materials of the mold release layer.

The surface roughness Ra of the mold release layer 1 is measured according to JIS B 0601:2013.

In the present embodiment, the mold release layer 1 is constituted of the first resin composition containing a resin.

The mold release layer contains, as the resin, one or two or more selected from a silicone resin, a fluororesin, a melamine resin, an epoxy resin, a phenolic resin, and an acrylic resin. Among them, from the viewpoint of improving the workability of the mold release film 10 while obtaining a favorable external appearance of the molded body, it is preferable that one or two or more selected from a silicone resin, a melamine resin, and an acrylic resin be contained, and it is more preferable that a melamine resin or an acrylic resin be contained.

(Silicone Resin)

The silicone resin is not particularly limited. For example, compounds containing two or more siloxane bonds (—Si—O—) such as various known or commercially available siloxane polymers can be used.

The silicone resin preferably contains one or two selected from vinyl group-containing organopolysiloxane (A) and organohydrogenpolysiloxane (B), for example. Thus, rubber-like characteristics such as elasticity and compressibility of silicone can be obtained, making it easier to obtain sufficient elongation of the mold release film and shape recoverability from the elongation.

<<Vinyl Group-Containing Organopolysiloxane (A)>>

The above-mentioned vinyl group-containing organopolysiloxane (A) can contain a vinyl group-containing linear organopolysiloxane (A1) having a linear structure.

The above-mentioned vinyl group-containing linear organopolysiloxane (A1) has a linear structure and contains a vinyl group, and this vinyl group serves as a crosslinking point during curing.

The content of vinyl groups of the vinyl group-containing linear organopolysiloxane (A1) is not particularly limited, but for example, it is preferable that two or more vinyl groups be contained in a molecule, and that the content thereof be equal to or less than 15 mol %. Accordingly, the amount of vinyl groups in the vinyl group-containing linear organopolysiloxane (A1) is optimized, which makes it possible to reliably form a network with each component to be described later.

In the present specification, the content of vinyl groups is mol % of vinyl group-containing siloxane units when all units constituting the vinyl group-containing linear organopolysiloxane (A1) are 100 mol %. However, it is thought that there is one vinyl group for one vinyl group-containing siloxane unit.

In addition, the degree of polymerization of the vinyl group-containing linear organopolysiloxane (A1) is not particularly limited, but for example, it is preferably within a range of about 1,000 to 10,000, and more preferably within a range of about 2,000 to 5,000. For example, the degree of polymerization can be obtained as a number average degree of polymerization (or number average molecular weight) in terms of polystyrene by gel permeation chromatography (GPC) in which chloroform is used as a developing solvent.

Furthermore, the specific gravity of the vinyl group-containing linear organopolysiloxane (A1) is not particularly limited, but it is preferably within a range of about 0.9 to 1.1.

By using a substance having a degree of polymerization and a specific gravity within the above-mentioned ranges as the vinyl group-containing linear organopolysiloxane (A1), it is possible to achieve improvement of heat resistance, flame retardance, chemical stability, and the like of obtained silicone rubber.

The vinyl group-containing linear organopolysiloxane (A1) is preferably a substance having a structure represented by Formula (1).

[Chem. 1]

(1)

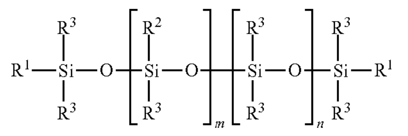

In Formula (1), $R^1$ is a substituted or unsubstituted alkyl group, alkenyl group, or aryl group having 1 to 10 carbon atoms, or a hydrocarbon group obtained by combining these groups. Examples of alkyl groups having 1 to 10 carbon atoms include a methyl group, an ethyl group, a propyl group, and the like, and among them, a methyl group is preferable. Examples of alkenyl groups having 1 to carbon atoms include a vinyl group, an allyl group, a butenyl group, and the like, and among them, a vinyl group is preferable. Examples of aryl groups having 1 to 10 carbon atoms include a phenyl group and the like.

In addition, $R^2$ is a substituted or unsubstituted alkyl group, alkenyl group, or aryl group having 1 to 10 carbon atoms, or a hydrocarbon group obtained by combining these groups. Examples of alkyl groups having 1 to 10 carbon atoms include a methyl group, an ethyl group, a propyl group, and the like, and among them, a methyl group is preferable. Examples of alkenyl groups having 1 to 10 carbon atoms include a vinyl group, an allyl group, and a butenyl group. Examples of aryl groups having 1 to 10 carbon atoms include a phenyl group.

In addition, $R^3$ is a substituted or unsubstituted alkyl group or aryl group having 1 to 8 carbon atoms, or a hydrocarbon group obtained by combining these groups. Examples of alkyl groups having 1 to 8 carbon atoms include a methyl group, an ethyl group, a propyl group, and the like, and among them, a methyl group is preferable. Examples of aryl groups having 1 to 8 carbon atoms include a phenyl group.

Furthermore, in Formula (1), examples of substituents of $R^1$ and $R^2$ include a methyl group, a vinyl group, and the like, and examples of substituents of $R^3$ include a methyl group and the like.

In Formula (1), a plurality of $R^1$'s are independent from each other, and they may be the same as or different from each other. Furthermore, the same applies to $R^2$ and $R^3$.

Furthermore, m and n are the number of repeating units constituting the vinyl group-containing linear organopolysiloxane (A1) represented by Formula (1), where m is an integer of 0 to 2,000, and n is an integer of 1,000 to 10,000. M is preferably 0 to 1,000, and n is preferably 2,000 to 5,000.

In addition, examples of specific structures of the vinyl group-containing linear organopolysiloxane (A1) represented by Formula (1) include a substance represented by Formula (1-1).

[Chem. 2]

(1-1)

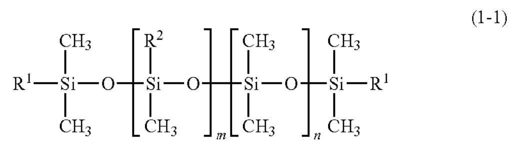

In Formula (1-1), $R^1$ and $R^2$ are each independently a methyl group or a vinyl group, and at least one of them is a vinyl group.

The vinyl group-containing linear organopolysiloxane (A1) may include a first vinyl group-containing linear organopolysiloxane (A1-1) in which two or more vinyl groups are contained in a molecule and the content of the vinyl groups is equal to or less than 0.4 mol %. The amount of vinyl groups of the first vinyl group-containing linear organopolysiloxane (A1-1) may be equal to or less than 0.1 mol %.

Furthermore, the vinyl group-containing linear organopolysiloxane (A1) may include the first vinyl group-containing linear organopolysiloxane (A1-1), and a second vinyl group-containing linear organopolysiloxane (A1-2) in which the content of vinyl groups is 0.5 to 15 mol %.

By combining the first vinyl group-containing linear organopolysiloxane (A1-1) with the second vinyl group-containing linear organopolysiloxane (A1-2) having a high content of vinyl groups as raw rubber which is a raw material of silicone rubber, vinyl groups can be unevenly distributed, and thereby it is possible to more effectively form sparseness and denseness in crosslinking density in a crosslinked network of silicone rubber. Due to that, the tear strength of the mold release film can be increased more effectively, and the dimensional stability and the transferability are also easily controlled.

Specifically, as the vinyl group-containing linear organopolysiloxane (A1), for example, it is preferable to use the first vinyl group-containing linear organopolysiloxane (A1-1) in which two or more of a unit in which $R^1$ is a vinyl group and/or a unit in which $R^2$ is a vinyl group are contained in a molecule in Formula (1-1) and the content thereof is equal to or less than 0.4 mol %, and to use the second vinyl group-containing linear organopolysiloxane (A1-2) in which the content of a unit in which $R^1$ is a vinyl group and/or a unit in which $R^2$ is a vinyl group is 0.5 to mol % in Formula (1-1).

Furthermore, in the first vinyl group-containing linear organopolysiloxane (A1-1), the content of vinyl groups is preferably 0.01 to 0.2 mol %. Furthermore, in the second vinyl group-containing linear organopolysiloxane (A1-2), the content of vinyl groups is preferably 0.8 to 12 mol %.

Furthermore, when the first vinyl group-containing linear organopolysiloxane (A1-1) and the second vinyl group-containing linear organopolysiloxane (A1-2) are combined and blended in, the ratio of (A1-1) to (A1-2) is not particularly limited, but for example, (A1-1):(A1-2) is preferably 50:50 to 95:5 in a weight ratio, and more preferably 80:20 to 90:10 in a weight ratio.

One type of each of the first vinyl group-containing linear organopolysiloxane (A1-1) and the second vinyl group-containing linear organopolysiloxane (A1-2) may be used alone, or two or more types thereof may be used in combination.

Furthermore, the vinyl group-containing organopolysiloxane (A) may contain a vinyl group-containing branched organopolysiloxane (A2) having a branched structure.

<<Organohydrogenpolysiloxane (B)>>

The organohydrogenpolysiloxane (B) is classified into a linear organohydrogenpolysiloxane (B1) having a linear structure and a branched organohydrogenpolysiloxane (B2) having a branched structure, and among them, one or both may be contained.

The linear organohydrogenpolysiloxane (B1), is a polymer which has a linear structure, has a structure (≡Si—H) in which hydrogen is directly bonded to Si, and undergoes as hydrosilylation reaction with vinyl groups of components contained in the raw material of the mold release layer 1 in addition to vinyl groups of the vinyl group-containing organopolysiloxane (A) to crosslink these components.

The molecular weight of the linear organohydrogenpolysiloxane (B1) is not particularly limited, but for example, the weight-average molecular weight thereof is preferably equal to or less than 20,000, and more preferably equal to or more than 1,000 and equal to or less than 10,000.

For example, the weight-average molecular weight of the linear organohydrogenpolysiloxane (B1) can be measured in terms of polystyrene by gel permeation chromatography (GPC) in which chloroform is used as a developing solvent.

In addition, in general, the linear organohydrogenpolysiloxane (B1) preferably does not have a vinyl group. Accordingly, the intramolecular crosslinking reaction of the linear organohydrogenpolysiloxane (B1) can be adequately prevented from proceeding.

As the linear organohydrogenpolysiloxane (B1) described above, for example, a substance having a structure represented by Formula (2) is preferably used.

[Chem. 3]

(2)

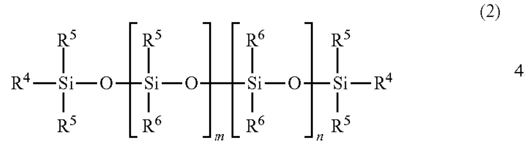

In Formula (2), $R^4$ is a substituted or unsubstituted alkyl group, alkenyl group, or aryl group having 1 to 10-carbon atoms, a hydrocarbon group obtained by combining these groups, or a hydride group. Examples of alkyl groups having 1 to 10 carbon atoms include a methyl group, an ethyl group, a propyl group, and the like, and among them, a methyl group is preferable. Examples of alkenyl groups having 1 to 10 carbon atoms include a vinyl group, an allyl group, a butenyl group, and the like. Examples of aryl groups having 1 to 10 carbon atoms include a phenyl group.

In addition, $R^5$ is a substituted or unsubstituted alkyl group, alkenyl group, or aryl group having 1 to 10 carbon atoms, a hydrocarbon group obtained by combining these groups, or a hydride group. Examples of alkyl groups having 1 to 10 carbon atoms include a methyl group, an ethyl group, and a propyl group, and among them, a methyl group is preferable. Examples of alkenyl groups having 1 to 10 carbon atoms include a vinyl group, an allyl group, a butenyl group, and the like. Examples of aryl groups having 1 to carbon atoms include a phenyl group.

In Formula (2), a plurality of $R^4$'s are independent from each other, and they may be the same as or different from each other. Furthermore, the same applies to $R^5$. However, at least two or more of the plurality of $R^4$'s and $R^5$'s are hydride groups.

In addition, $R^6$ is a substituted or unsubstituted alkyl group or aryl group having 1 to 8 carbon atoms, or a hydrocarbon group obtained by combining these groups. Examples of alkyl groups having 1 to 8 carbon atoms include a methyl group, an ethyl group, a propyl group, and the like, and among them, a methyl group is preferable. Examples of aryl groups having 1 to 8 carbon atoms include a phenyl group. A plurality of $R^6$'s are independent from each other, and they may be the same as or different from each other.

In addition, examples of substituents of $R^4$, $R^5$, and $R^6$ in Formula (2) include a methyl group, a vinyl group, and the like, and a methyl group is preferable from the viewpoint of preventing an intramolecular crosslinking reaction.

Furthermore, m and n are the number of repeating units constituting the linear organohydrogenpolysiloxane (B1) represented by Formula (2), where m is an integer of 2 to 150, and n is an integer of 2 to 150. m is preferably an integer of 2 to 100, and n is preferably an integer of 2 to 100.

One type of the linear organohydrogenpolysiloxane (B1) may be used alone, or two or more types thereof may be used in combination.

Since the branched organohydrogenpolysiloxane (B2) has a branched structure, it is a component which forms a region having a high crosslinking density and thereby greatly contributes to formation of a structure having sparseness and denseness in crosslinking density in a silicone rubber-based system. Furthermore, similarly to the linear organohydrogenpolysiloxane (B1), it is a polymer which has a structure (≡Si—H) in which hydrogen is directly bonded to Si, and undergoes a hydrosilylation reaction with vinyl groups of components contained in the raw material of the mold release layer 1 in addition to vinyl groups of the vinyl group-containing organopolysiloxane (A) to crosslink these components.

Furthermore, the specific gravity of the branched organohydrogenpolysiloxane (B2) is within a range of 0.9 to 0.95.

Furthermore, in general, the branched organohydrogenpolysiloxane (B2) preferably does not have a vinyl group. Accordingly, the intramolecular crosslinking reaction of the branched organohydrogenpolysiloxane (B2) can be adequately prevented from proceeding.

In addition, the branched organohydrogenpolysiloxane (B2) is preferably a substance represented by Average Composition Formula (c).

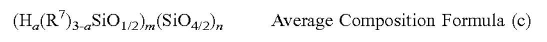

$$(H_a(R^7)_{3-a}SiO_{1/2})_m(SiO_{4/2})_n \quad \text{Average Composition Formula (c)}$$

(In Formula (c), $R^7$ is a monovalent organic group, a is an integer within a range of 1 to 3, m is the number of $H_a(R^7)_{3-a}SiO_{1/2}$ units, and n is the number of $SiO_{4/2}$ units)

In Formula (c), $R^7$ is a monovalent organic group, and is preferably a substituted or unsubstituted alkyl group or aryl group having 1 to 10 carbon atoms, or a hydrocarbon group obtained by combining these groups. Examples of alkyl groups having 1 to 10 carbon atoms include a methyl group, an ethyl group, a propyl group, and the like, and among them, a methyl group is preferable. Examples of aryl groups having 1 to 10 carbon atoms include a phenyl group.

In Formula (c), a is the number of hydride groups (hydrogen atoms directly bonded to Si), and it is an integer within a range of 1 to 3, and is preferably 1.

In addition, in Formula (c), m is the number of $H_a(R^7)_{3-a}SiO_{1/2}$ units, and n is the number of $SiO_{4/2}$ units.

The branched organohydrogenpolysiloxane (B2) has a branched structure. The linear organohydrogenpolysiloxane (B1) and the branched organohydrogenpolysiloxane (B2) are different in that their structures are linear or branched. When the number of Si is 1, the number (R/Si) of alkyl groups R bonded to Si is within a range of 1.8 to 2.1 for the linear organohydrogenpolysiloxane (B1) and is within a range of 0.8 to 1.7 for the branched organohydrogenpolysiloxane (B2).

Since the branched organohydrogenpolysiloxane (B2) has a branched structure, for example, when it is heated to 1,000° C. at a temperature rising rate of 10° C./minute in a nitrogen atmosphere, the amount of residues is equal to or more than 5%. On the other hand, since the linear organohydrogenpolysiloxane (B1) is linear, the amount of residues after it is heated under the above-mentioned condition is almost zero.

In addition, specific examples of the branched organchydrogenpolysiloxane (B2) include a substance having a structure represented by Formula (3).

[Chem. 4]

(3)

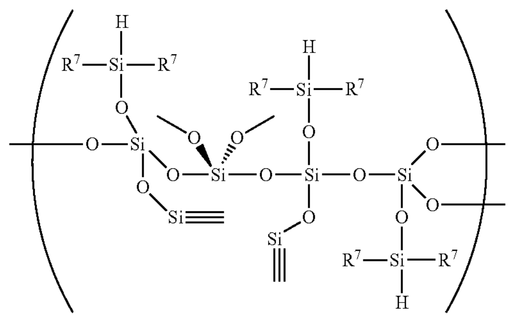

In Formula (3), $R^7$ is a substituted or unsubstituted alkyl group or aryl group having 1 to 8 carbon atoms, a hydrocarbon group obtained by combining these groups, or a hydrogen atom. Examples of alkyl groups having 1 to 8 carbon atoms include a methyl group, an ethyl group, a propyl group, and the like, and among them, a methyl group is preferable. Examples of aryl groups having 1 to 8 carbon atoms include a phenyl group. Examples of substituents of $R^7$ include a methyl group and the like.

In Formula (3), a plurality of $R^7$'s are independent from each other, and they may be the same as or different from each other.

Furthermore, in Formula (3), "—O—Si≡" represents that Si has a branched structure spreading three-dimensionally.

One type of the branched organohydrogenpolysiloxane (B2) may be used alone, or two or more types thereof may be used in combination.

In addition, in each of the linear organohydrogenpolysiloxane (B1) and the branched organohydrogenpolysiloxane (B2), the amount of hydrogen atoms (hydride groups) directly bonded to Si is not particularly limited.

However, in the mold release layer 1, the total amount of hydride groups in the linear organohydrogenpolysiloxane (B1) and the branched organohydrogenpolysiloxane (B2) is preferably 0.5 to 5 mol and is more preferably 1 to 3.5 mol with respect to 1 mol of vinyl groups in the vinyl group-containing linear organopolysiloxane (A1). Accordingly, a crosslinked network can be reliably formed between the linear organohydrogenpolysiloxane (B1) and the branched organohydrogenpolysiloxane (B2), and the vinyl group-containing linear organopolysiloxane (A1).

(Fluororesin)

Specific examples of the above-mentioned fluororesins include polymers of monomers such as tetrafluoroethylene, hexafluoropropylene, chlorotrifluoroethylene, vinylidene fluoride, vinyl fluoride, and perfluoroalkyl vinyl ether; and copolymers of two or more types of monomers. Among them, one type may be used alone, or two or more types may be used in combination.

(Melamine Resin)

The above-mentioned melamine resin is obtained by polycondensing a melamine compound and formaldehyde under a neutral or weak alkali condition, for example. Specific examples thereof include alkylated melamine resins such as methylated melamine resins and butylated melamine resins, methylolated melamine resins, and alkyletherified melamine resins.

Among them, a methylated melamine resin containing structural units derived from methylated melamine is preferable. The methylated melamine resin has at least one methoxymethyl group (—$CH_2OCH_3$) and has an average degree of polymerization of 1.1 to 10.

(Epoxy Resin)

As the above-mentioned epoxy resins, all monomers, oligomers, and polymers having two or more epoxy groups in one molecule can be used regardless of their molecular weight and molecular structure. As specific examples of such epoxy resins, one or two or more selected from the following examples may be contained: bisphenol-type epoxy resins such as a bisphenol A type epoxy resin, a bisphenol F type epoxy resin, a bisphenol E type epoxy resin, a bisphenol S type epoxy resin, a hydrogenated bisphenol A type epoxy resin, a bisphenol M type epoxy resin (4,4'-(1,3-phenylenediisoprediene) bisphenol type epoxy resin), a bisphenol P type epoxy resin (4,4'-(1,4-phenylenediisoprediene) bisphenol type epoxy resin), and a bisphenol Z type epoxy resin (4,4'-cyclohexidiene bisphenol type epoxy resin); novolac type epoxy resins such as a phenolic novolac type epoxy resin, a brominated phenolic novolac type epoxy resin, a cresol novolac type epoxy resin, a tetraphenol group ethane type novolac type epoxy resin, and a novolac type epoxy resin having a condensed ring aromatic hydrocarbon structure; biphenyl type epoxy resins; aralkyl type epoxy resins such as a xylylene type epoxy resin and a biphenyl aralkyl type epoxy resin; epoxy resins having a naphthalene skeleton such as a naphthylene ether type epoxy resin, a naphthol type epoxy resin, a naphthalene type epoxy resin, a naphthalene diol type epoxy resin, difunctional to tetrafunctional epoxy type naphthalene resins, a binaphthyl type epoxy resin, and a naphthalene aralkyl type epoxy resin; anthracene type epoxy resins; phenoxy type epoxy resins; dicyclopentadiene type epoxy resins; norbornene type epoxy resins; adamantane type epoxy resins; heterocyclic epoxy resins such as a fluorene type epoxy resin, a phosphorus-containing epoxy resin, an alicyclic epoxy resin, an aliphatic chain epoxy resin, a bisphenol A novolac type epoxy resin, a bixylenol type epoxy resin, a triphenolmethane type epoxy resin, a trihydroxyphenylmethane type epoxy resin, a tetraphenylolethane type epoxy resin, and a triglycidyl isocyanurate; glycidylamines such as N,N,N',N'-tetraglycidyl metaxylene diamine, N,N,N',N'-tetraglycidylbisaminomethylcyclohexane, and N,N-diglycidylaniline; a copolymer of glycidyl (meth)acrylate and a compound having an ethylenically unsaturated double bond; an epoxy resin having a butadiene structure; diglycidyl-etherified bisphenol; diglycidyl-etherified naphthalenediol; and glycidyl-etherified phenols.

(Phenolic Resin)

As the above-mentioned phenolic resins, one or two or more selected from the following examples can be contained: novolac type phenolic resins such as phenolic novolac resin, cresol novolac resin, tert-butylphenol novolac resin, and nonylphenol novolac resin; phenol aralkyl resins such as phenylene skeleton-containing phenol aralkyl resins and biphenylene skeleton-containing phenol aralkyl resins; and phenolic resins having a condensed polycyclic structure such as a naphthalene skeleton and an anthracene skeleton.

(Acrylic Resin)

Specific examples of the acrylic resins include acrylic acid esters such as acrylic acid, methacrylic acid, methyl acrylate, ethyl acrylate, butyl acrylate, and 2-ethylhexyl acrylate; methacrylic acid esters such as methyl methacrylate, ethyl methacrylate, and butyl methacrylate; and resins composed of monomers such as acrylonitrile, methacrylonitrile, and acrylamide. Constituent monomers of the acrylic resins include one or two or more types of monomers in these examples. In addition, as the constituent monomers of the acrylic resins, monomers other than those in these examples may be further included. Furthermore, derivatives of these monomers may also be used.

The first resin composition may contain other components in addition to the above-mentioned resins within a range not impairing the characteristics of the mold release film 10. The other components are not limited, and the following examples can be blended in as appropriate: particles, coupling agents, acid catalysts, solvents, antistatic agents, leveling agents, dispersants, pigments, dyes, antioxidants, flame retardants, thermal conductivity improvers, and the like; polybutadiene, polyisoprene, polychloroprene, polypentadiene, polybutene, polyisobutylene, polystyrene, an isoprene-butadiene copolymer, a styrene-isoprene copolymer, polyolefin, and their derivatives; silicone resins; an isocyanate group-containing compound; an epoxy group-containing compound; amines; carboxylic acid anhydrides; and long-chain alkyl group-containing alcohols. Representative components will be described below.

(Particles)

The mold release layer 1 may contain particles. Thus, the surface roughness of the surface 11 of the mold release film 10 can be easily controlled regardless of a film formation method of the mold release layer 1. That is, when the mold release layer 1 is a stretched film, it is difficult to perform embossing processing on the surface 11 of the mold release film 10 on the mold release layer 1 side. However, when the mold release layer 1 contains particles, the surface roughness can be controlled regardless of whether the mold release layer 1 is a stretched film or an un-stretched film. In addition, when comparing to the case of attempting to perform a roughening treatment on the surface 11 of the mold release film 10 on the mold release layer 1 side, the surface roughness can be easily increased according to the size and the content of the particles.

Examples of the particles contained in the mold release layer 1 include one or two or more organic particles selected from the group consisting of a melamine resin, a polystyrene resin, an acrylic resin, a polyimide resin, a polyester resin, a silicone resin, a polypropylene resin, a polyethylene resin, and a fluororesin, and/or inorganic particles. The mold release layer 1 of the present embodiment can contain one or two or more of these particles.

Examples of the above-mentioned inorganic particles include silicates such as talc, calcined clay, uncalcined clay, mica, and glass; oxides such as titanium oxide, alumina, boehmite, and silica; carbonates such as calcium carbonate, magnesium carbonate, and hydrotalcite; hydroxides such as aluminum hydroxide, magnesium hydroxide, and calcium hydroxide; sulfates or sulfites such as barium sulfate, calcium sulfate, and calcium sulfite; borates such as zinc borate, barium metaborate, aluminum borate, calcium borate, and sodium borate; nitrides such as aluminum nitride, boron nitride, silicon nitride, and carbon nitride; and titanates such as strontium titanate and barium titanate. Among them, one type may be used alone, or two or more types may be used in combination.

The inorganic particles may be subjected to a surface treatment from the viewpoint of enhancing adhesiveness to the mold release layer 1. The surface treatment is appropriately selected according to the organic material constituting the mold release layer 1. For example, when the mold release layer 1 contains a melamine resin, examples of the surface treatment include use of a coupling agent having functional groups such as amine, epoxy, and isocyanate. The coupling agent will be described later.

The content of the particles contained in the mold release layer 1 is preferably 10 to 50 mass %, more preferably 15 to 45 mass %, and further preferably 20 to 40 mass % with respect to the total amount of the mold release layer 1.

By setting the content of the particles to be equal to or more than the above-mentioned lower limit value, the surface roughness of the surface 11 can be increased, thereby obtaining favorable mold releasability and handleability.

On the other hand, by setting the content of the particles to be equal to or less than the above-mentioned upper limit value, favorable film-forming properties can be maintained.

When gloss is imparted to the molded body obtained using the mold release film 10, the content of the particles may be 0 mass %.

(Silane Coupling Agent)

The silane coupling agent can have a hydrolyzable group. The hydrolyzable group is hydrolyzed by water to form a hydroxyl group, and this hydroxyl group undergoes a dehydration condensation reaction with a hydroxyl group on the surface of inorganic particles, whereby the surface of the inorganic particles can be modified.

In addition, the silane coupling agent can include silane coupling agents having reactive groups such as a vinyl group, an epoxy group, an isocyanate group, and an amino group. Thus, the inorganic particles surface-modified with the silane coupling agent can react with the resin in the mold release layer 1, and as a result, the inorganic particles can be prevented from coming off the mold release layer 1.

(Acid Catalyst)

The acid catalyst is not particularly limited, but examples thereof include inorganic acids and organic acids. Examples of the inorganic acids include hydrochloric acid, sulfuric acid, nitric acid, and phosphoric acid. Examples of the organic acids include organic carboxylic acids, organic sulfonic acids, and organic phosphoric acids.

Examples of the organic carboxylic acids include oxalic acid, acetic acid, and formic acid. Examples of the organic sulfonic acids include methanesulfonic acid, trifluoromethanesulfonic acid, isoprenesulfonic acid, camphorsulfonic acid, hexanesulfonic acid, octanesulfonic acid, nonanesulfonic acid, decanesulfonic acid, hexadecanesulfonic acid, benzenesulfonic acid, p-toluenesulfonic acid, cumenesulfonic acid, dodecylbenzenesulfonic acid, naphthalenesulfonic acid, and nonylnaphthalenesulfonic acid.

Examples of the organic phosphoric acids include methyl acid phosphate, ethyl acid phosphate, propyl acid phosphate, isopropyl acid phosphate, butyl acid phosphate, butoxyethyl acid phosphate, octyl acid phosphate, 2-ethylhexyl acid phosphate, decyl acid phosphate, lauryl acid phosphate, stearyl acid phosphate, oleyl acid phosphate, behenyl acid phosphate, phenyl acid phosphate, nonylphenyl acid phosphate, cyclohexyl acid phosphate, phenoxyethyl acid phosphate, alkoxypolyethylene glycol acid phosphate, bisphenol A acid phosphate, dimethyl acid phosphate, diethyl acid phosphate, dipropyl acid phosphate, diisopropyl acid phosphate, dibutyl acid phosphate, dioctyl acid phosphate, di-2-ethylhexyl acid phosphate, dioctyl acid phosphate, dilauryl acid phosphate, distearyl acid phosphate, diphenyl acid phosphate, and bisnonylphenyl acid phosphate.

In addition, examples of thermal acid generators include sulfonium salts, benzothiazolium salts, ammonium salts, and phosphonium salts.

For such acid catalysts, one type may be used alone, or two or more types may be used in combination.

(Solvent)

The first resin composition may contain a solvent, for example, depending on the manufacturing method of the mold release layer 1. When a solvent is contained, the mold release layer 1 can be produced by dissolving the first resin composition in the solvent and coating.

Specific examples of the solvents include, but are not limited to, water; aliphatic hydrocarbons such as pentane, hexane, cyclohexane, heptane, methylcyclohexane, ethylcyclohexane, octane, decane, dodecane, and tetradecane; aromatic hydrocarbons such as benzene, toluene, ethylbenzene, xylene, trifluoromethylbenzene, and benzotrifluoride; ethers such as diethyl ether, diisopropyl ether, dibutyl ether, cyclopentyl methyl ether, cyclopentyl ethyl ether, ethylene glycol dimethyl ether, ethylene glycol diethyl ether, diethylene glycol dimethyl ether, 1,4-dioxane, 1,3-dioxane, and tetrahydrofuran; haloalkanes such as dichloromethane, chloroform, 1,1-dichloroethane, 1,2-dichloroethane, 1,1,1-trichloroethane, and 1,1,2-trichloroethane; carboxylic acid amides such as N,N-dimethylformamide and N,N-dimethylacetamide; sulfoxides such as dimethyl sulfoxide and diethyl sulfoxide; and alcohols such as ethanol, isopropyl alcohol, and butanol. Among them, one type may be used alone, or two or more types may be used in combination.

[Second Base Material Layer 2]

In the present embodiment, the second base material layer 2 forms the surface 21 on one side of the mold release film 10 and is a resin layer constituting the surface on the side that comes into contact with a metal mold when the mold release film 10 is disposed in the metal mold.

The thickness of the second base material layer 2 is preferably to 100 μm, more preferably 15 to 80 mm, and further preferably to 50 μm.

By setting the thickness of the second base material layer 2 to be equal to or more than the above-mentioned lower limit value, the rigidity can be increased, which makes it possible to maintain favorable handleability, while maintaining the followability of the mold release film 10. On the other hand, by setting the thickness of the second base material layer 2 to be equal to or less than the above-mentioned upper limit value, the flexibility of the mold release film 10 is improved, making it easier to obtain mold followability.

In the present embodiment, the second base material layer 2 is a stretched or un-stretched film composed of a second resin composition containing a resin. Whether the film stretches or un-stretches can be appropriately set according to the combination of the mold release layer 1 and the first base material layer 3, but the stretched film is preferable when attempting to improve the rigidity of the film, and the un-stretched film is preferable when attempting to improve the moldability.

In addition, stretching can be manufactured using known methods such as sequential biaxial stretching, simultaneous biaxial stretching, and tubular stretching.

In the present embodiment, the second base material layer 2 contains, as a resin, one or two or more selected from a polyester resin, a polyolefin resin, and a polyamide resin. Among them, a polyester resin and a polyolefin resin are preferable.

(Polyester Resin)

Specific examples of the above-mentioned polyester resins include polyethylene terephthalate resin (PET), polybutylene terephthalate resin (PBT), polytrimethylene terephthalate resin (PTT), polyhexamethylene terephthalate resin (PHT), and polyethylene naphthalate resin (PEN). Among them, one type may be used alone, or two or more types may be used in combination.

(Polyolefin Resin)

The above-mentioned polyolefin resin is a resin having structural units derived from α-olefins such as ethylene, propylene, and butene, and known resins can be used. Specific examples of the polyolefin resins include polyethylene (PE) such as low-density polyethylene (LDPE), medium-density polyethylene (MDPE), high-density polyethylene (HDPE), and linear low-density polyethylene (LLDPE); polypropylene (PP); polyvinyl alcohol (PVA); an ethylene-vinyl acetate copolymer (EVA); an ethylene-methyl acrylate copolymer (EMA); an ethylene-acrylic acid copolymer (EAA); an ethylene-methyl methacrylate copolymer (EMMA); an ethylene-ethyl acrylate copolymer (EEA); an ethylene-methacrylic acid copolymer (EMAA); an ionomer resin; an ethylene-vinyl alcohol copolymer (EVOH); and a cyclic olefin resin (COP). Among them, one type may be used alone, or two or more types may be used in combination.

(Polyamide Resin)

Examples of the above-mentioned polyamide resins include aliphatic polyamides and aromatic polyamides. Specific examples of the aliphatic polyamides include polyamide 6, polyamide 6,6, a polyamide 6-6,6 copolymer, polyamide 11, and polyamide 12. Specific examples of the aromatic polyamides include polyamide 61, polyamide 66/6T, polyamide 6T/6, and polyamide 12/6T.

The second resin composition may contain other components in addition to the above-mentioned components within a range not impairing the characteristics of the mold release film 10. The other components are not limited, and the same components as those listed for the first resin composition can be used.

[First Base Material Layer 3]

In the present embodiment, the first base material layer 3 is a resin layer positioned between the mold release layer 1 and the second base material layer 2 in the mold release film 10 having a multilayer structure.

In the present embodiment, the first base material layer 3 can impart moderate stiffness to the mold release film 10 and can improve handleability while maintaining the followability of the mold release film 10.

The thickness of the first base material layer 3 is preferably adjusted appropriately according to the thickness of the second base material layer 2, and the total thickness of the first base material layer 3 and the second base material layer 2 is preferably to 70 μm and is more preferably 30 to 50 μm.

By setting the total thickness of the first base material layer 3 and the second base material layer 2 to be equal to or more than the above-mentioned lower limit value, the rigidity can be increased, which makes it possible to maintain favorable handleability, while maintaining the followability of the mold release film 10. On the other hand, by setting the total thickness of the first base material layer 3 and the second base material layer 2 to be equal to or less than the above-mentioned upper limit value, the flexibility of the mold release film 10 is improved, making it easier to obtain mold followability.

In the present embodiment, the first base material layer 3 is a stretched or un-stretched film composed of a third resin composition containing a resin. Whether the film stretches or un-stretches can be appropriately set according to the combination of the mold release layer 1 and the second base material layer 2, but the stretched film is preferable when attempting to improve the rigidity of the film, and the un-stretched film is preferable when attempting to improve the moldability.

In addition, stretching can be manufactured using known methods such as sequential biaxial stretching, simultaneous biaxial stretching, and tubular stretching.

As the third resin composition, the same components as those described for the second resin composition constituting the second base material layer 2 can be used.

In addition, the third resin composition and the second resin composition may be the same as or different from each other.

In the present embodiment, the first base material layer 3 contains one or two or more selected from a polyester resin, a polyolefin resin, and a polyamide resin. As these polyester resins, polyolefin resins, and polyamide resins, the same resins as those described for the second base material layer 2 can be used.

Among them, as the first base material layer 3, polyamide resins are preferable, and polyester resins are more preferable.

<Manufacturing Method of Mold Release Film>

Next, a manufacturing method of the mold release film 10 of the present embodiment will be described.

Known methods can be used as the manufacturing method of the mold release film 10, or of the mold release layer 1, the first base material layer 3, and the second base material layer 2. For example, manufacturing can be performed using known methods such as a coextrusion method, an extrusion lamination method, a dry lamination method, an inflation method, an inflation extrusion method, and a T-die extrusion method.

Specifically, for example, the mold release film 10 may be obtained by (i) forming the film-shaped second base material layer 2 and the film-shaped first base material layer 3, laminating the second base material layer 2 and the first base material layer 3 by lamination processing or the like, coating the first base material layer 3 thereafter with a coating liquid (varnish or paste) of the first resin composition constituting the mold release layer 1, and curing to form and laminate the mold release layer 1; or by (ii) separately forming the film-shaped mold release layer 1, the second base material layer 2, and the first base material layer 3, laminating thereafter such that the first base material layer 3 is sandwiched between the mold release layer 1 and the second base material layer 2, and bonding through lamination processing, an adhesive layer, or the like. By adopting the manufacturing method of the above-mentioned (i), the thickness of the mold release layer 1 can be reduced more simply and stably. By adopting the manufacturing method of the above-mentioned (ii), the thickness of the mold release layer 1 can be increased more simply and stably.

When the mold release layer 1, the second base material layer 2, and the first base material layer 3 are formed separately, known methods such as an extrusion molding method, a calendar molding method, a press molding method, and a coating method can be used for all of the layers to obtain the film. In addition, each of the obtained films can be subjected to a stretching treatment as necessary.

Furthermore, when using the above-mentioned coating method, for example, a laminated structure of the first base material layer 3 and the mold release layer 1 can be obtained by uniformly mixing the first resin composition constituting the mold release layer 1 with an arbitrary kneading device to prepare a coating liquid (varnish or paste), and coating the first base material layer 3 with this coating liquid.

The temperature during kneading is appropriately set according to the type of resin. For example, as a roll set temperature, the temperature is preferably about 10° C. to 70° C., and more preferably about 25° C. to 30° C. Furthermore, the kneading time is preferably about 5 minutes to 1 hour, and more preferably about 10 to 40 minutes, for example. A kneading device is not particularly limited, but for example, a kneader, two rolls, a Banbury mixer (continuous kneader), a pressure kneader, and the like can be used.

Next, the surface to be coated is coated with the obtained coating liquid to form a coating film.

A coating method is not particularly limited, and various known methods are used. Examples thereof include roll coaters, reverse roll coaters, gravure coaters, knife coaters, and bar coaters. When attempting to form a laminated structure while winding or feeding any of the mold release layer 1, the second base material layer 2, and the first base material layer 3 on a roll in a roll-to-roll method, it is preferable to reduce the tension caused by winding or feeding as much as possible. In addition, regarding the coating amount, the weight after curing is preferably 0.01 to 10 g/m$^2$, and more preferably 0.05 to 5 g/m$^2$.

Each of the coating films can be made into a desired film by being cured thereafter. A curing condition is 90° C. to 170° C. for 30 seconds to 5 minutes, for example.

Second Embodiment

A mold release film of the second embodiment may have a monolayer structure, or may have a multilayer structure that has a mold release layer serving as at least one surface of the mold release film, that is, a mold release surface, and that has a base material layer made of a material different from that of the mold release layer. The multilayer structure i's preferable from the viewpoint of achieving both sufficient elongation and elastic recovery from elongation at a higher level. Details will be described below with the case in which the mold release film has a multilayer structure as an example.

Figure 2:
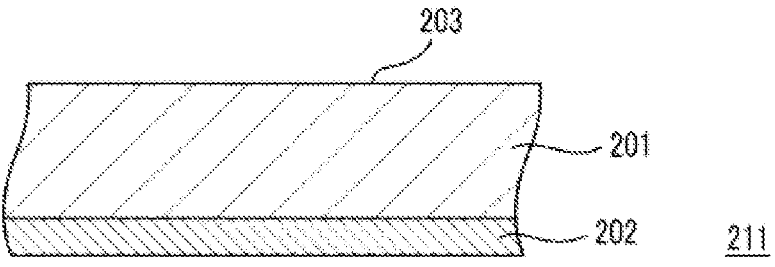
FIG. 2 is a cross-sectional view schematically showing a cross section of a mold release film of the second embodiment.

FIG. 2 is a cross-sectional view schematically showing a cross section of the mold release film of the second embodiment.

As shown in FIG. 2, a mold release film 211 of the present embodiment includes a base material layer 202 and a mold release layer 201 laminated on the base material layer 202.

The mold release film 211 of the present embodiment satisfies the following (a) and (b):

(a) the 5% tensile strength (5% modulus) of the mold release film 211 at 180° C. is equal to or more than 1.0 MPa and equal to or less than 5.0 MPa, and (b) $\alpha 1$ is equal to or more than 0.20 and equal to or less than 0.80 when X1 (MPa) is a breaking strength at 25° C., X2 (MPa) is a breaking strength at 180° C., and $(1-(X1-X2)/X1)$ is $\alpha 1$.

Thus, while sufficient elongation is obtained, the shape recoverability from elongation can also be obtained, which makes it possible to effectively prevent the generation of wrinkles and strain on the mold release film 211. Although the details of the reason for this are not clear, it is presumed as follows.

First, it is presumed that the index of (a) makes it easier to control the ability of the mold release film 211 to return to its original shape from elongation. In addition, it is presumed that the index of (b) makes it possible to maintain the strength against deformation while moderately obtaining ease of deformation during heating. Then, by controlling the indexes of (a) and (b) at the same time, a high level of balance between sufficient elongation and recoverability from elongation can be embodied. It is thought that due to that, wrinkles and strain which may be generated when using the mold release film can be effectively prevented.

In the above-mentioned (a), the 5% tensile strength (5% modulus) at 180° C. is equal to or more than 1.0 MPa and equal to or less than 5.0 MPa, is preferably 1.0 to 4.0, and is more preferably 1.5 to 3.0.

In the above-mentioned (b), $\alpha 1$ is equal to or more than 0.20 and equal to or less than 0.80, is preferably 0.20 to 0.70, and is more preferably 0.20 to 0.50.

The mold release film 211 of the present embodiment preferably further satisfies the following (c).

(c) The Young's modulus of the mold release film 211 at 180° C. is equal to or more than 25 MPa and equal to or less than 110 MPa, is preferably 50 to 100 MPa, and is more preferably 50 to 80 MPa.

By setting the Young's modulus at 180° C. within the above-mentioned numerical value range, a moderate flexibility is obtained for the mold release film 211, which makes it possible to enhance metal mold followability during vacuum adhesion. Because a metal mold is generally heated during vacuum adhesion, the followability of the mold release film 211 is controlled more appropriately by controlling the Young's modulus at 180° C.

The mold release film 211 of the present embodiment preferably further satisfies the following (d).

(d) The rate of dimensional change of the mold release film 211 is equal to or more than 4% and equal to or less than 40%, is preferably 5% to 35%, and is more preferably 7% to 30% when a temperature is raised from 30° C. to 180° C. at 2° C./minute with a tensile load of 500 mN according to the thermomechanical analysis (TMA).

It is presumed that by setting the rate of dimensional change within the above-mentioned numerical value range, it becomes easy to obtain elongation against local stress and deformation, making the mold release film 211 to be partially elongated more easily when fitting a lower metal mold and an upper metal mold, and thereby the generation of wrinkles and strain on the entire mold release film 211 is easily prevented.

The indexes of the above-mentioned (a) to (d) can be embodied by appropriately selecting and combining the following known methods, and using an approach different from the conventional methods. The above-mentioned known methods are the type and the blending amount of the raw material of the mold release layer 201, a preparation method of the raw material, a manufacturing method of the mold release film 211, and the like.

Among them, for example, when a silicone resin is selected as the raw material for the mold release layer 201, appropriate control of the type and the blending ratio of the silicone resin, and of a crosslinking density, a crosslinked structure, and the like of the resin; improvement of a blending ratio of an inorganic filler and dispersibility of the inorganic filler; and the like are elements for setting the above-mentioned indexes within desired numerical value ranges.

In addition, by adjusting the curing condition, the temperature, and the time for obtaining the mold release layer 201, the crosslinking density, the crosslinked structure, and the like of the resin can be appropriately controlled, which makes it possible to set the above-mentioned indexes within desired numerical value ranges. Furthermore, for example, when producing by sandwiching between base materials in the manufacturing step of the mold release film, the surface roughness can also be changed depending on the surface state. In addition, controlling the combination of the materials for the mold release layer 201 and the base material layer 202 is effective.

The thickness of the mold release film 211 is preferably equal to or more than 5 μm and equal to or less than 150 μm, more preferably equal to or more than 10 μm and equal to or less than 100 μm, and further preferably equal to or more than 15 μm and equal to or less than 80 μm.

Each of the layers of the mold release film 211 of the present embodiment will be described below.

[Mold Release Layer]

The mold release layer 201 forms one surface of the mold release film 211 and has a mold release surface 203.

The thickness of the mold release layer 201 is preferably equal to or more than 0.1 μm and equal to or less than 150 μm, more preferably equal to or more than 1 μm and equal to or less than 100 μm, further preferably equal to or more than 5 μm and equal to or less than 50 μm, and even further preferably equal to or less than 30 μm.

By setting the thickness of the mold release layer 201 to be equal to or more than the above-mentioned lower limit value, the rigidity of the mold release film 211 is increased, making it easier to prevent excessive deformation and the generation of wrinkles. Due to that, mold followability and dimensional stability can be obtained. On the other hand, by setting the thickness of the mold release layer 201 to be equal to or less than the above-mentioned upper limit value, the rigidity of the mold release film 211 can be controlled, which makes it possible to achieve a favorable balance between mold followability and mold releasability.

The mold release surface 203 of the mold release layer 201 is a surface that comes into contact with a sealing resin, which will be described later, when using the mold release film 211. The surface roughness Rz of the mold release surface 203 is preferably 0.05 to 10 μm, and is more preferably 0.08 to 7 μm.

By setting the surface roughness Rz of the mold release surface 203 to be equal to or more than the above-mentioned lower limit value, a favorable balance between mold releasability and mold followability at the time of molding can be achieved. On the other hand, by setting the surface roughness Rz of the mold release surface 203 to be equal to or less than the above-mentioned upper limit value, a favorable mold releasability can be obtained while maintaining mold followability and dimensional stability.

As a controlling method of the surface roughness of the mold release surface 203, adjustment can be performed by a known method such as transferring an embossed pattern to the film using a roll that has been subjected to embossing processing in the manufacturing step of the mold release film 211, or blending particles into the materials of the mold release layer 201. The surface roughness Rz of the mold release layer 201 is measured according to JIS B 0601:2013.

The mold release layer 201 is constituted of a first resin composition containing a resin.

As the first resin composition, the same resin composition as described in the first embodiment can be used.

[Manufacturing Method of Mold Release Layer]

Next, a manufacturing method of the mold release layer 201 of the present embodiment will be described.

As the manufacturing method of the mold release layer 201 of the present embodiment, the mold release layer 201 can be obtained by preparing the above-mentioned first resin composition, forming the first resin composition into a film shape, and curing. The details will be described below.

First, each component of the first resin composition is uniformly mixed with arbitrary kneading device to prepare the first resin composition.

The details will be described below with an example in which a silicone resin is used as the resin.

[1] For example, a vinyl group-containing organopolysiloxane (A), an inorganic filler, and a silane coupling agent are weighed in predetermined amounts, and thereafter kneaded with an arbitrary kneading device to obtain a kneaded material.

In addition, water may be added as necessary when obtaining this kneaded material. Thus, a reaction between the silane coupling agent and the inorganic filler can proceed more reliably.

Furthermore, the above-mentioned kneading is preferably performed through a first step of heating at a first temperature and a second step of heating at a second temperature. Thus, in the first step, the surface of the inorganic filler can be surface-treated with the coupling agent, and in the second step, by-products generated from the reaction between the inorganic filler and the coupling agent can be reliably removed from the kneaded material. Thereafter, as necessary, the component (A) may be added to the obtained kneaded material and further kneaded. Thus, the affinity of the components in the kneaded material can be improved.

The first temperature is preferably about 40° C. to 120° C. for example, and is more preferably about 60° C. to 90° C. for example. The second temperature is preferably about 130° C. to 210° C. for example, and is more preferably about 160° C. to 180° C. for example.

In addition, the atmosphere in the first step is preferably an inert atmosphere such as a nitrogen atmosphere, and the atmosphere in the second step is preferably a reduced pressure atmosphere.

Furthermore, the time of the first step is preferably about 0.3 to 1.5 hours, and is more preferably about 0.5 to 1.2 hours, for example. The time of the second step is preferably about 0.7 to 3.0 hours, and is more preferably about 1.0 to 2.0 hours, for example.

By performing the first step and the second step under the above-mentioned condition, the above-mentioned effect can be more significantly obtained.

[2] Next, predetermined amounts of the organohydrogenpolysiloxane (B) and a catalyst are weighed, and thereafter, each of the components is kneaded with the kneaded material prepared in the above-mentioned step [1] by using an arbitrary kneading device to obtain the first resin composition. The obtained first resin composition may be a paste containing a solvent.

When kneading each of the component (B) and the catalyst, it is preferable that the kneaded material preliminarily prepared in the above-mentioned step [1] be kneaded with the organohydrogenpolysiloxane (B), the kneaded material prepared in the above-mentioned step [1] be kneaded with the catalyst, and thereafter each of the kneaded materials be kneaded. Thus, each of the components can be reliably dispersed in the first resin composition without causing the reaction between the vinyl group-containing organopolysiloxane (A) and the organohydrogenpolysiloxane (B) to proceed.

For example, the temperature when kneading each of the component (B) and the catalyst is preferably about 10° C. to 70° C. and is more preferably about 25° C. to 30° C. as a roll set temperature.

Furthermore, the kneading time is preferably about 5 minutes to 1 hour, and more preferably about 10 to 40 minutes, for example.

In the above-mentioned step [1] and the above-mentioned step [2], by setting the temperature within the above-mentioned range, the reaction between the vinyl group-containing organopolysiloxane (A) and the organohydrogenpolysiloxane (B) can be adequately prevented or inhibited from proceeding. Furthermore, in the above-mentioned step [1] and the above-mentioned step [2], by setting the kneading time within the above-mentioned range, each of the components can be more reliably dispersed in the first resin composition.

The kneading device used in each of the steps [1] and [2] is not particularly limited, but for example, a kneader, two rolls, a Banbury mixer (continuous kneader), a pressure kneader, and the like can be used.

Furthermore, in the present step [2], a reaction inhibitor such as 1-ethynylcyclohexanol may be added to the kneaded material. Thus, even when the temperature of the kneaded material is set to a relatively high temperature, the reaction between the vinyl group-containing organopolysiloxane (A) and the organohydrogenpolysiloxane (B) can be more adequately prevented or inhibited from proceeding.

[3] Next, the first resin composition obtained in the step [2] may be dissolved in a solvent to be made into a paste.

[4] Next, the mold release layer 201 is formed by processing the first resin composition into a film shape and curing.

Specifically, the first resin composition is molded into a film shape by an extrusion molding method, a calendar molding method, a press molding method, coating, or the like. The surface shape of a roll or the like may be transferred or embossed at the time of film formation.

In the present embodiment, in a step of curing the first resin composition, for example, after heating (primary curing) at 100° C. to 250° C. for 1 to 30 minutes, post baking (secondary curing) is performed at 100° C. to 250° C. for 1 to 4 hours.

Through the steps described above, the mold release layer 201 in which the first resin composition of the present embodiment is used, that is, the mold release film 211 is obtained.

[Base Material Layer 202]

In the mold release film 211 of the present embodiment, the base material layer 202 is used from the viewpoint of imparting a moderate rigidity in order to exhibit the shape stability and the manufacturing stability of the mold release film 211, the mold release function of the mold release layer, and the like.

The thickness of the base material layer 202 is preferably equal to or more than 5 μm and equal to or less than 50 μm, more preferably equal to or more than 9 μm and equal to or less than 35 μm, and further preferably equal to or more than 12 μm and equal to or less than 25 μm.

By setting the thickness of the base material layer 202 to be equal to or more than the above-mentioned the above-mentioned lower limit value, the rigidity of the mold release film 211 is increased, making it easier to prevent excessive deformation and the generation of wrinkles. Due to that, mold followability and dimensional stability can be obtained. On the other hand, by setting the thickness of the base material layer 202 to be equal to or less than the above-mentioned upper limit value, the rigidity of the mold release film 211 can be controlled, which makes it possible to achieve a favorable balance between mold followability and mold releasability.

Examples of the materials for the base material layer 202 include one or two or more selected from a polyester resin, a polyamide resin, and a polyolefin resin.

Examples of the polyester resins, the polyamide resins, and the polyolefin resins mentioned above are the same as those described for the mold release layer 201.

In addition, a stretched film may be used as the base material layer 202, and stretching can be manufactured using known methods such as sequential biaxial stretching, simultaneous biaxial stretching, and tubular stretching.

[Manufacturing Method of Mold Release Film]

As a formation method of the mold release film 211, manufacturing can be performed by using known methods such as a coextrusion method, an extrusion lamination method, a dry lamination method, and an inflation method. The mold release layer 201 may be formed on the base material layer 202 by coating the surface of the base material layer 202 with the first resin composition prepared as a paste form.

In the mold release film 211, for example, the mold release layer 201 and the base material layer 202 may be manufactured separately and then bonded by using a laminator or the like. In addition, the mold release layer 201 and the base material layer 202 may be bonded as they are, or may be bonded through an adhesive layer.

A manufacturing method of the base material layer 202 is not limited, but specific examples thereof include an inflation extrusion method and a T-die extrusion method.

An example of a reference aspect of the second embodiment will be described below.

[1]

A mold release film satisfying the following (a) and (b):

(a) a 5% tensile strength (5% modulus) of the mold release film at 180° C. is equal to or more than 1.0 MPa and equal to or less than 5.0 MPa, and (b) $\alpha 1$ is equal to or more than 0.20 and equal to or less than 0.80 when X1 (MPa) is a breaking strength at 25° C., X2 (MPa) is a breaking strength at 180° C., and $(1-(X1-X2)/X1)$ is $\alpha 1$.

[2]

The mold release film according to [1], which satisfies the following (c):

(c) the Young's modulus of the mold release film at 180° C. is equal to or more than 25 MPa and equal to or less than 110 MPa.

[3]

The mold release film according to [1] or [2], which satisfies the following (d):

(d) the rate of dimensional change of the mold release film is equal to or more than 4% and equal to or less than 40% when a temperature is raised from 30° C. to 180° C. at 2° C./minute with a tensile load of 500 mN according to a thermomechanical analysis (TMA).

[4]

The mold release film according to any one of [1] to [0.3], in which the mold release film has a multilayer structure that has a mold release layer serving as at least one surface of the mold release film and that has a base material layer made of a material different from that of the mold release layer.

[5]

The mold release film according to any one of [1] to [4], in which in a sealing resin molding process for a resin-sealed semiconductor device in which a semiconductor device is resin-sealed, the mold release film is provided and used by being disposed between a mold and the above-mentioned semiconductor device.

Third Embodiment

A mold release film of the third embodiment may have a monolayer structure, or may have a multilayer structure that has a mold release layer serving as at least one surface of the mold release film, that is, a mold release surface, and that has a base material layer made of a material different from that of the mold release layer. The multilayer structure is preferable from the viewpoint of achieving both sufficient elongation and elastic recovery from elongation at a higher level. Details will be described below with the case in which the mold release film has a multilayer structure as an example.

Figure 3:
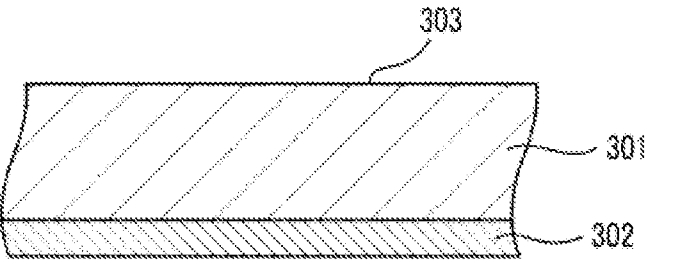
FIG. 3 is a cross-sectional view schematically showing a cross section of a mold release film of the third embodiment.

FIG. 3 is a cross-sectional view schematically showing a cross section of the mold release film of the third embodiment.

As shown in FIG. 3, a mold release film 311 of the present embodiment includes a base material layer 302 and a mold release layer 301 laminated on the base material layer 302.

The mold release film 311 of the present embodiment satisfies the following (a) in a TMA curve obtained from the relationship between the temperature measured by stretching the mold release film under the condition of a temperature rising rate of 2° C./minute and a load of 500 mN, and the amount of dimensional change in the length of the mold release film in thermomechanical analysis (TMA) measurement.

(a) $\alpha 1$ is 0.1 to 1.0 when an amount of dimensional change at 170° C. is X1(%), an amount of dimensional change at 190° C. is X2(%), and $(X2-X1)/(190-170)$ is $\alpha 1$.

Alternatively, the mold release film 311 of the present embodiment satisfies the following (b) in a TMA curve obtained from the relationship between the temperature measured by stretching the mold release film under the condition of a temperature rising rate of 2° C./minute and a load of 500 mN, and the amount of dimensional change in the length of the mold release film in thermomechanical analysis (TMA) measurement.

(b) $\alpha 1/\alpha 2$ is 6 to 35 when an amount of dimensional change at 170° C. is X1(%), an amount of dimensional change at 190° C. is X2(%), and $(X2-X1)/(190-170)$ is al, and when an amount of dimensional change at 25° C. is X3(%), an amount of dimensional change at 100° C. is X4(%), and $(X4-X3)/(100-25)$ is $\alpha 2$.

Thus, while sufficient elongation is obtained, the shape recoverability from elongation can also be obtained, which makes it possible to effectively prevent the generation of wrinkles and strain on the mold release film 311. Although the details of the reason for this are not clear, it is presumed as follows.

It is presumed that the index of (a) prevents the amount of rapid dimensional change of the mold release film 311 when heating a metal mold, thereby maintaining a moderate strength and obtaining dimensional stability and shape recoverability, which makes it less likely for wrinkles and strain to be generated on the mold release film 311.

In addition, it is thought that, using the index of (b) controls the balance between the amount of dimensional change of the mold release film 311 in the process of being disposed in a metal mold and heated from the room temperature state before using the mold release film 311, and the amount of dimensional change of the mold release film 311 when heating the metal mold. This makes it possible to embody a high level of balance between sufficient elongation and recoverability from elongation, and due to that, wrinkles and strain which may be generated when using the mold release film can be effectively prevented.

In the above-mentioned (a), $\alpha 1$ is 0.1 to 1.0, preferably 0.2 to 0.9, and more preferably 0.3 to 0.7.

In the above-mentioned (b), $\alpha 1/\alpha 2$ is 6 to 35, preferably 8 to 30, and more preferably 10 to 28.

In the present embodiment, regarding thermomechanical analysis (TMA) measurement, the measurement can be performed using a commercially available thermomechanical analyzer (for example, TMA7100 (manufactured by Hitachi High-Tech Corporation) and the like) under the following measurement condition.

(Measurement Condition)

Temperature range: 0° C. to 250° C.

Temperature rising rate: 2° C./minute

Load: 500 mN

Test piece: 4 mm width×10 mm

Test mode: compression

In the mold release film 311 of the present embodiment, the breaking elongation at 80° C. is preferably equal to or more than 100% and equal to or less than 850%, and is more preferably 100% to 300%.

When the breaking elongation is equal to or more than the above-mentioned lower limit value, flexible elongation is possible against tension. When the breaking elongation is equal to or less than the above-mentioned upper limit value, shape recoverability from elongation is obtained.

The indexes of (a) and (b) in the above-mentioned third embodiment and the breaking elongation can be embodied by appropriately selecting and combining the following known methods, and using an approach different from the conventional methods. The above-mentioned known methods are the type and the blending amount of the raw material of the mold release layer 301, a preparation method of the raw material, a manufacturing method of the mold release film 311, and the like.

Among them, for example, when a silicone resin is selected as the raw material for the mold release layer 301, appropriate control of the type and the blending ratio of the silicone resin, and of a crosslinking density, a crosslinked structure, and the like of the resin; improvement of a blending ratio of an inorganic filler and dispersibility of the inorganic filler; and the like are elements for setting the above-mentioned indexes within desired numerical value ranges.

In addition, by adjusting the curing condition, the temperature, and the time for obtaining the mold release layer 301, the crosslinking density, the crosslinked structure, and the like of the resin can be appropriately controlled, which makes it possible to set the above-mentioned indexes within desired numerical value ranges. Furthermore, for example, when producing by sandwiching between base materials in the manufacturing step of the mold release film 311, the surface roughness can also be changed depending on the surface state. In addition, controlling the combination of the materials for the mold release layer 301 and the base material layer 302 is effective.

The thickness of the mold release film 311 is preferably equal to or more than 5 μm and equal to or less than 150 μm, more preferably equal to or more than 10 μm and equal to or less than 100 μm, and further preferably equal to or more than 15 μm and equal to or less than 80 μm.

Each of the layers of the mold release film 311 of the present embodiment will be described below.

[Mold Release Layer]

The mold release layer 301 forms one surface of the mold release film 311 and has a mold release surface 303.

The thickness of the mold release layer 301 is preferably equal to or more than 0.1 μm and equal to or less than 150 μm, more preferably equal to or more than 1 μm and equal to or less than 100 μm, further preferably equal to or more than 5 μm and equal to or less than 50 μm, and even further preferably equal to or less than 30 μm.

By setting the thickness of the mold release layer 301 to be equal to or more than the above-mentioned lower limit value, the rigidity of the mold release film 311 is increased, making it easier to prevent excessive deformation and the generation of wrinkles. Due to that, mold followability and dimensional stability can be obtained. On the other hand, by setting the thickness of the mold release layer 301 to be equal to or less than the above-mentioned upper limit value, the rigidity of the mold release film 311 can be controlled, which makes it possible to achieve a favorable balance between mold followability and mold releasability.

The mold release surface 303 of the mold release layer 301 is a surface that comes into contact with a sealing resin, which will be described later, when using the mold release film 311. The surface roughness Rz of the mold release surface 303 is preferably 0.05 to 10 μm, and is more preferably 0.08 to 7 μm.

By setting the surface roughness Rz of the mold release surface 303 to be equal to or more than the above-mentioned lower limit value, a favorable balance between mold releasability and mold followability at the time of molding can be achieved. On the other hand, by setting the surface roughness Rz of the mold release surface 303 to be equal to or less than the above-mentioned upper limit value, a favorable mold releasability can be obtained while maintaining mold followability and dimensional stability.

As a controlling method of the surface roughness of the mold release surface 303, adjustment can be performed by a known method such as transferring an embossed pattern to the film using a roll that has been subjected to embossing processing in the manufacturing step of the mold release film 211, or blending particles into the materials of the mold release layer 301.

The surface roughness Rz of the mold release layer 301 is measured according to JIS B 0601:2013.

The mold release layer 301 is constituted of a first resin composition containing a resin.

As the first resin composition, the same resin composition as described in the first embodiment can be used.

[Manufacturing Method of Mold Release Layer]

Next, a manufacturing method of the mold release layer 301 of the present embodiment can be performed in the same manner as the manufacturing method of the mold release layer 201 of the above-mentioned second embodiment.

[Base Material Layer 302]

In the mold release film 311 of the present embodiment, the base material layer 302 is used from the viewpoint of imparting a moderate rigidity in order to exhibit the shape stability and the manufacturing stability of the mold release film 311, the mold release function of the mold release layer, and the like.

The thickness of the base material layer 302 is preferably equal to or more than 5 μm and equal to or less than 50 μm, more preferably equal to or more than 9 μm and equal to or less than 35 μm, and further preferably equal to or more than 12 μm and equal to or less than 25 μm.

By setting the thickness of the base material layer 302 to be equal to or more than the above-mentioned the above-mentioned lower limit value, the rigidity of the mold release film 311 is increased, making it easier to prevent excessive deformation and the generation of wrinkles. Due to that, mold followability and dimensional stability can be obtained. On the other hand, by setting the thickness of the base material layer 302 to be equal to or less than the above-mentioned upper limit value, the rigidity of the mold release film 311 can be controlled, which makes it possible to achieve a favorable balance between mold followability and mold releasability.

Examples of the materials for the base material layer 302 include one or two or more selected from a polyester resin, a polyamide resin, and a polyolefin resin.

Examples of the polyester resins, the polyamide resins, and the polyolefin resins mentioned above are the same as those described for the mold release layer 301.

In addition, a stretched film may be used as the base material layer 302, and stretching can be manufactured using known methods such as sequential biaxial stretching, simultaneous biaxial stretching, and tubular stretching.

[Manufacturing Method of Mold Release Film]

As a manufacturing method of the mold release film 311, the same method as described in the manufacturing method of the mold release film of the second embodiment can be used.

An example of a reference aspect of the third embodiment will be described below.

[1]

A mold release film satisfies the following (a) in a TMA curve obtained from the relationship between the temperature measured by stretching the mold release film under the condition of a temperature rising rate of 2° C./minute and a load of 500 mN, and the amount of dimensional change in the length of the mold release film in thermomechanical analysis (TMA) measurement.

(a) $\alpha 1$ is 0.1 to 1.0 when an amount of dimensional change at 170° C. is X1(%), an amount of dimensional change at 190° C. is X2(%), and (X2−X1)/(190−170) is $\alpha 1$.

[2]

The mold release film satisfies the following (b) in a TMA curve obtained from the relationship between the temperature measured by stretching the mold release film under the condition of a temperature rising rate of 2° C./minute and a load of 500 mN, and the amount of dimensional change in the length of the mold release film in thermomechanical analysis (TMA) measurement.

(b) $\alpha 1/\alpha 2$ is 6 to 35 when an amount of dimensional change at 170° C. is X1(%), an amount of dimensional change at 190° C. is X2(%), and (X2−X1)/(190−170) is al, and when an amount of dimensional change at 25° C. is X3(%), an amount of dimensional change at 100° C. is X4(%), and (X4−X3)/(100−25) is $\alpha 2$.

[3]

The mold release film according to [1] or [2], in which the breaking elongation at 180° C. is equal to or more than 100% and equal to or less than 850%.

[4]

The mold release film according to any one of [1] to [3], in which the mold release film has a multilayer structure that has a mold release layer serving as at least one surface of the mold release film and that has a base material layer made of a material different from that of the mold release layer.

[5]

The mold release film according to any one of [1] to [4], in which in a sealing resin molding process for a resin-sealed semiconductor device in which a semiconductor device is resin-sealed, the mold release film is provided and used by being disposed between a mold and the above-mentioned semiconductor device.

<Usage and Use Method of Mold Release Film>

All of the mold release film 10 of the first embodiment, the mold release film 211 of the second embodiment, and the mold release film 311 of the third embodiment are provided and used by being disposed between a mold to which a sealing resin is supplied and a semiconductor device to be resin-sealed in a resin sealing step for the semiconductor device. In other words, the above-mentioned mold release films may be so-called mold release films for mold molding, or may be used for other usages. Examples of the other usages include usage for disposition between a cover film and a metal mold when producing a flexible printed circuit board (hereinafter also referred to as "FPC") by adhering a coverlay film (hereinafter also referred to as "CL film") to a flexible film having an exposed circuit (hereinafter also referred to as "circuit-exposed film") through an adhesive by heat pressing. In addition, for example, the above-mentioned mold release films can also be used as a mold release film when curing a thermosetting resin prepreg such as CFRP, a mold release film for thermosetting resin molding, a decorative transfer mold release film for performing printing on a product having a three-dimensional shape, and the like.

An example of a manufacturing method of a resin-sealed semiconductor device using the mold release film 10 will be described below with reference to the mold release film 10.

The manufacturing method of a resin-sealed semiconductor device includes the following steps.

(Step 1) Semiconductor device preparation step (Step 2) Mold release film installation step (Step 3) Sealing resin supply step (Step 4) Curing step (Step 5) Molded body demolding step The details of each of the steps will be described below.

(Step 1) Semiconductor Device Preparation Step

A semiconductor device is a device in which electrode pads on circuit wiring provided on a support are electrically connected to electrodes provided on a semiconductor element.

Examples of the semiconductor elements include optical elements such as light emitting elements and light receiving elements. Examples of the light emitting elements include an LED chip (light emitting diode), and examples of light receiving elements include an image sensor.

In addition, the support is a substrate formed in an arbitrary shape such as a circular shape or a polygonal shape. Examples of the supports include rigid substrates such as ceramic substrates, silicone substrates, metal substrates, epoxy resins, and BT resins; and flexible substrates such as polyimide resins and polyethylene substrates.

(Step 2) Mold Release Film Installation Step

The mold release film 10 is disposed in a lower metal mold having a cavity recess for supplying a sealing resin. At this time, disposition is performed such that the mold release surface 3 of the mold release film 10 is on the front side, that is, on the side coming into contact with the sealing resin to be supplied later.

Furthermore, the mold release film 10 is placed inside the cavity recess of the lower metal mold and along the surface of a flat portion surrounding the cavity recess. At this time, the flat portion surrounding the cavity recess is provided with a suction port for causing the mold release film 10 to follow the shape of the cavity recess of the lower metal mold. From such a suction port, air, moisture, gas, and the like in the space between the mold release film 10 and the mold are sucked and discharged for vacuum adsorption by using a suction device or the like. Furthermore, in order to firmly fix the mold release film 10 to the mold, the mold release film 10 may be sandwiched by a mechanism in which a chuck is disposed at a position corresponding to the outer circumferential part of a sealing resin injection region, the outer circumferential part of the entire mold release film 10, or the outer circumferential part of the entire mold.

Examples of the molds include known metal molds and resin molds.

(Step 3) Sealing Resin Supply Step

Next, the sealing resin is supplied to the region which is the recess of the mold and in which the mold release film 10 is disposed. A known method can be used as a supply method. In addition, a known resin can be used for the sealing resin. Examples thereof include one or mixtures of silicone resins, epoxy resins, acrylic resins, fluororesins, polyimide resins, silicone-modified epoxy resins, and the like, and precursors thereof.

In the present embodiment, when the mold release film 10 is applied to a compression mold molding method (compression molding method), the shape of the sealing resin is preferably processed into a tablet shape, a granular shape, a sealing granule shape, or a sheet shape.

In the mold, the sealing resin is in a fluid state by being heated to a predetermined temperature.

(Step 4) Curing Step

Next, the semiconductor device that is an object to be molded is attached to an upper metal mold provided with a protruded fixation device for holding the outer edge of the object to be molded such that the object to be molded does not fall. The surface on which the semiconductor element of the semiconductor device is provided is caused to face the lower metal mold, and pressure welding against the mold in which the sealing resin has been supplied to the recess is performed. At this time, the fixation device of the upper metal mold is fitted into a groove part of the lower metal mold, and the semiconductor element is covered with the sealing resin. Subsequently, the sealing resin is cured by heating and pressurizing to obtain a molded body.

When the sealing resin is a precursor of a curable resin, it may be cured by heating and irradiation with active energy rays. Examples of the active energy rays include radiation, ultraviolet rays, visible light ray, and electron beams.

(Step 5) Molded Body Demolding Step

Thereafter, the molded body is removed from the mold. In the molded body demolding step, the mold release film 10 is peeled off from the mold by supplying air, moisture, gas, and the like between the mold release film 10 and the mold, thereby demolding the molded body. At the same time or after this, the mold release film 10 is released from the molded body.

When the number of semiconductor elements provided on the support is one, this molded body becomes a resin-sealed semiconductor device.

Thus, the semiconductor device having a favorable external appearance is obtained.

Although the embodiments of the present invention have been described above, these embodiments are examples of the present invention, and various configurations other than the above-mentioned embodiments can be adopted. Furthermore, the present invention is not limited to the above-mentioned embodiments, and the present invention includes modifications, improvements, and the like within a range in which the object of the present invention can be achieved.

EXAMPLES

Hereinafter, the present invention will be described in detail with reference to examples, but the present invention is not limited to the description of these examples.

First Experiment (1) Preparation of First Resin Composition

A first resin composition was prepared using the raw materials described below.

(Vinyl Group-Containing Organopolysiloxane (A))

Vinyl group-containing linear organopolysiloxane (A1-1) in which the content of vinyl groups is low (hereinafter also referred to as "low-vinyl group-containing linear organopolysiloxane"): vinyl group-containing dimethylpolysiloxane synthesized according to Synthesis Scheme 1 (a structure which is represented by Formula (1-1) above and in which only $R^1$ (terminal) is a vinyl group).

Vinyl group-containing linear organopolysiloxane (A1-2) in which the content of vinyl groups is high (hereinafter also referred to as "high-vinyl group-containing linear organopolysiloxane"): vinyl group-containing dimethylpolysiloxane synthesized according to Synthesis Scheme 2 (a structure which is represented by Formula (1-1) above and in which $R^1$ and $R^2$ are each a vinyl group).

(Organohydrogenpolysiloxane (B))

Manufactured by Momentive: "TC-25D"

(Inorganic Filler)

Inorganic filler (C): silica fine particles (particle diameter 7 nm, specific surface area 300 $m^2/g$), "AEROSIL 300" manufactured by Nippon Aerosil Co., Ltd.

(Silane Coupling Agent)

Silane coupling agent (D-1): hexamethyldisilazane (HMDZ), "HEXAMETHYLDISILAZANE (SIH 6110.1)" manufactured by Gelest.

Silane coupling agent (D-2): divinyltetramethyldisilazane, "1,3-DIVINYLTETRAMETHYLDISILAZANE (SID 4612.0)" manufactured by Gelest.

(Platinum or Platinum Compound (E))

Manufactured by Momentive: "TC-25A"

(Synthesis of Vinyl Group-Containing Organopolysiloxane (A))

[Synthesis Scheme 1: Synthesis of Low-Vinyl Group-Containing Linear Organopolysiloxane (A1-1)]

The low-vinyl group-containing linear organopolysiloxane (A1-1) was synthesized according to Formula (5).

That is, 74.7 g (252 mmol) of octamethylcyclotetrasiloxane and 0.1 g of potassium siliconate were put in a 300 mL separable flask which had a cooling pipe and a stirring blade and which had been replaced with Ar gas. A temperature was raised, and stirring was performed at 120° C. for 30 minutes. At this time, an increase in viscosity could be confirmed.

Thereafter, the temperature was raised to 155° C., and stirring was continued for 3 hours. Then, after 3 hours, 0.1 g (0.6 mmol) of 1,3-divinyltetramethyldisiloxane was added, and stirring was further performed at 155° C. for 4 hours.

Furthermore, after 4 hours, dilution with 250 mL of toluene was performed, and washing with water was performed 3 times thereafter. The washed organic layer was washed several times with 1.5 L of methanol to reprecipitate and to be purified, and the oligomer and the polymer were separated. The obtained polymer was dried under reduced pressure at 60° C. overnight to obtain the low-vinyl group-containing linear organopolysiloxane (A1-1) (Mn=$2.2\times10^5$, Mw=$4.8\times10^5$). In addition, the content of vinyl groups calculated by H-NMR spectrum measurement was 0.04 mol %.

[Chem. 5]

Formula (5)

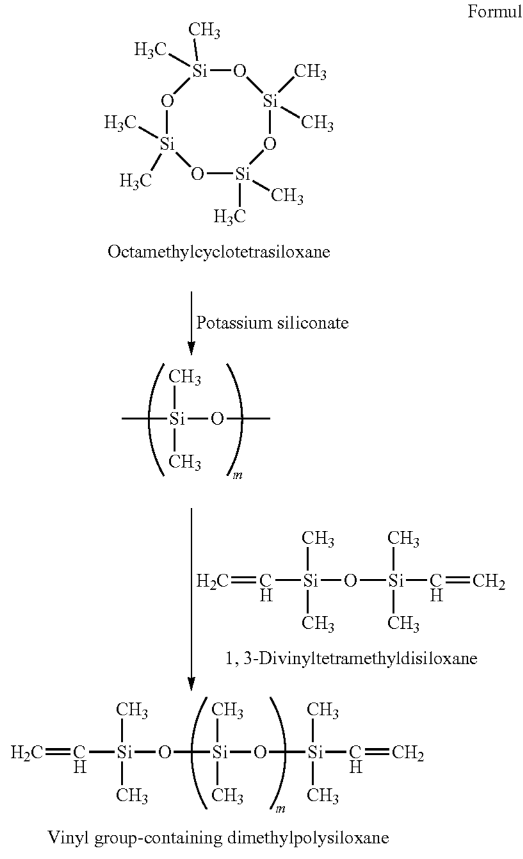

Octamethylcyclotetrasiloxane 1, 3-Divinyltetramethyldisiloxane

Vinyl group-containing dimethylpolysiloxane

[Synthesis Scheme 2: Synthesis of High-Vinyl Group-Containing Linear Organopolysiloxane (A1-2)]

The high-vinyl group-containing linear organopolysiloxane (A1-2) (Mn=$2.3\times10^5$, Mw=$5.0\times10^5$) was synthesized as shown in Formula (6) by the same synthesis step for (A1-1) except that 0.86 g (2.5 mmol) of 2,4,6,8-tetramethyl-2,4,6,8-tetravinylcyclotetrasiloxane was used in addition to 74.7 g (252 mmol) of octamethylcyclotetrasiloxane in the above-mentioned synthesis step for (A1-1). In addition, the content of vinyl groups calculated by H-NMR spectrum measurement was 0.92 mol %.

[Chem. 6]

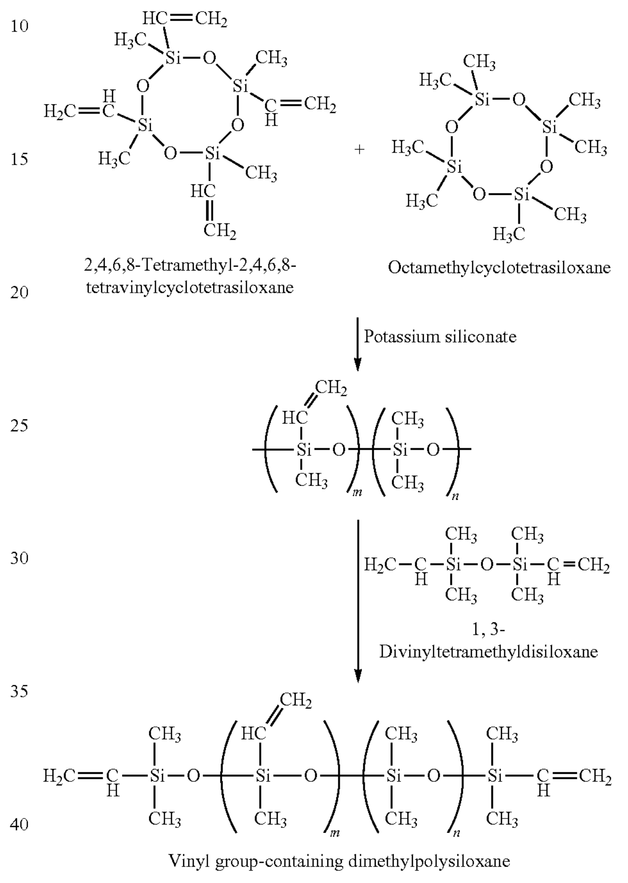

2,4,6,8-Tetramethyl-2,4,6,8-tetravinylcyclotetrasiloxane

Octamethylcyclotetrasiloxane 1, 3-Divinyltetramethyldisiloxane

Vinyl group-containing dimethylpolysiloxane

Next, a mixture of 90% of the vinyl group-containing organopolysiloxane (A), the silane coupling agent, and water (F) was pre-kneaded in a ratio shown in Table 1 below. Thereafter, the inorganic filler was added to the mixture and further kneaded to obtain a kneaded material (silicone rubber compound).

Kneading after the addition of the inorganic filler was performed through a first step of kneading for 1 hour under the condition of 60° C. to 90° C. under a nitrogen atmosphere for a coupling reaction, and a second step of kneading for 2 hours under the condition of 160° C. to 180° C. under a reduced pressure atmosphere for removing by-products (ammonia). Thereafter, cooling was performed, and the remaining 10% of the vinyl group-containing organopolysiloxane (A) was added in two portions and kneaded for 20 minutes.

Subsequently, the organohydrogenpolysiloxane (B) (TC-25D) and the platinum or platinum compound (E) (TC-25A) were added to 100 parts by weight of the obtained kneaded material (silicone rubber compound) in a ratio shown in Table 1 below, and were kneaded with a roll to obtain each first resin composition.

TABLE 1

| | Silicone rubber composition | | Unit | First resin composition |
|---|---|---|---|---|
| Kneaded material | Vinyl group-containing organopolysiloxane (A) | (A1-1) | Part by weight | 80 |
| | | (A1-2) | | 20 |
| | Inorganic filler | (C) | | 25 |
| | Silane coupling agent | (D-1) | | 10.0 |
| | | (D-2) | | 0.5 |
| | Water | | | 5.3 |
| Additive | Organohydrogenpolysiloxane (B) | | Parts by weight with respect to 100 parts by weight of kneaded material | 5.3 |
| | Platinum or platinum compound (E) | | | 0.5 |

(2) Creation of Mold Release Film

Each mold release film of examples and comparative examples of the first experiment were produced in the following manner.

Example 1

As shown in Tables 2-1 and 2-2, a 15 μm-thick biaxially oriented polybutylene terephthalate (OPBT: manufactured by TOYOBO CO., LTD., TOYOBOESTER (registered trademark) film, DE048) was used as a first base material layer, and a 25 μm-thick polybutylene terephthalate film (CPBT: manufactured by Okura Industrial Co., Ltd., ESRM) was used as a second base material layer. The first base material layer and the second base material were laminated by using an adhesive for laminate (TM593 (main agent), CAT-10L (curing agent), manufactured by Toyo-Morton, Ltd. (solid content: 25 mass %, solvent: ethyl acetate)). Furthermore, the first base material layer was coated with a prepared melamine mold release agent (melamine: manufactured by Arakawa Chemical Industries, Ltd., ARACOAT, RL3021 (main agent)/RA2000 (curing agent)) (solid content: 10 mass %, solvent: IPA) using a bar coater. Curing was performed at 120° C. for 1 minute to obtain a mold release film having a mold release layer on the first base material layer. The thickness of the mold release layer of the obtained mold release film was 40 μm, and the surface roughness Ra of the mold release surface of the mold release layer was 0.12 μm.

Example 2

A mold release film was created in the same manner as in Example 1 except that as a mold release layer, the above-mentioned melamine mold release agent was changed to an acrylic mold release agent (acrylic: manufactured by TOKUSHIKI CO., Ltd., SQ100 (main agent)/UAX-615 (curing agent)) (solid content: 10 mass %, solvent: ethyl acetate) as shown in Tables 2-1 and 2-2. The drying condition was 80° C. for 3 minutes and 40° C. for 3 days.

Example 3

A mold release layer was formed by changing, as a mold release layer, the melamine mold release agent to a paste (solid content: mass %, solvent: decane) composed of the first resin composition prepared in (2) above as shown in Tables 2-1 and 2-2, and thereby a lamination film was obtained. A mold release film was created in the same manner as in Example 1 except that embossing processing was performed on the surface of the mold release layer by sandwiching the obtained lamination film between a roll and a matte film when winding the lamination film on the roll. The mold release layer was cured at 180° C. for 120 minutes.

Example 4

A mold release film was created in the same manner as in Example 3 except that the surface roughness of the matte film was changed as shown in Tables 2-1 and 2-2.

Example 5

A mold release film was created in the same manner as in Example 1 except that the second base material layer was changed to a 35 μm-thick polybutylene terephthalate film (CPBT: manufactured by Okura Industrial Co., Ltd., ESRM) as shown in Tables 2-1 and 2-2.

Example 6

A mold release film was created in the same manner as in Example 1 except that the first base material layer was changed to a 25 μm-thick polybutylene terephthalate film (CPBT: manufactured by Okura Industrial Co., Ltd., ESRM), and the second base material layer was changed to a 15 μm-thick biaxially oriented polybutylene terephthalate (OPBT: manufactured by TOYOBO CO., LTD., TOYOBOESTER (registered trademark) film, DE048) as shown in Tables 2-1 and 2-2.

Example 7

A mold release film was created in the same manner as in Example 1 except that the first base material layer was changed to a 13 μm-thick biaxially oriented polyethylene terephthalate (OPET1: manufactured by Toyobo Film Solution Ltd., TEFLEX (registered trademark) film FW2), and the second base material layer was changed to a 25 μm-thick polybutylene terephthalate film (CPBT: manufactured by Okura Industrial Co., Ltd., ESRM) as shown in Tables 2-1 and 2-2.

Example 8

A mold release film was created in the same manner as in Example 1 except that the first base material layer was changed to a 40 μm-thick biaxially oriented polypropylene film (OPP: manufactured by Toray Industries, Inc., TORAYFAN (registered trademark) film #40-2500), and the second base material layer was changed to a 15 μm-thick biaxially oriented polybutylene terephthalate (OPBT: manufactured by TOYOBO CO., LTD., a TOYOBOESTER (registered trademark) film, DE048) as shown in Tables 2-1 and 2-2.

Example 9

A mold release film was created in the same manner as in Example 1 except that the first base material layer was changed to a 15 μm-thick biaxially oriented nylon film (ONy: manufactured by UNITIKA LTD., EMBLEM (registered trademark) film ON-15), and the second base material layer was changed to a 15 μm-thick biaxially oriented polybutylene terephthalate (OPBT: manufactured by TOYOBO CO., LTD., a TOYOBOESTER (registered trademark) film, DE048) as shown in Tables 2-1 and 2-2.

Example 10

A mold release film was created in the same manner as in Example 1 except that the first base material layer was changed to a 25 μm-thick nylon film (CNy: manufactured by UBE INDUSTRIES, LTD., UBE Nylon (registered trademark) 1022B) which was manufactured by extrusion film formation, and the second base material layer was changed to a 15 μm-thick biaxially oriented polybutylene terephthalate (OPBT: manufactured by TOYOBO CO., LTD., a TOYOBOESTER (registered trademark) film, DE048) as shown in Tables 2-1 and 2-2.

Comparative Example 1

A mold release film was created in the same manner as in Example 1 except that only a 15 μm-thick biaxially oriented polybutylene terephthalate (OPBT: manufactured by TOYOBO CO., LTD., TOYOBOESTER (registered trademark) film, DE048) as the first base material layer was used for the base material layer as shown in Tables 2-1 and 2-2.

Comparative Example 2

A mold release film was created in the same manner as in Example 1 except that only a 20 μm-thick biaxially oriented polybutylene terephthalate (OPBT: manufactured by TOYOBO CO., LTD., TOYOBOESTER (registered trademark) film, DE048) as the first base material layer was used for the base material layer as shown in Tables 2-1 and 2-2.

Comparative Example 3

A mold release film was created in the same manner as in Example 1 except that only a 50 μm-thick biaxially oriented polyethylene terephthalate (OPET2: manufactured by TOYOBO CO., LTD., TOYOBOESTER (registered trademark) film, E5100) as the first base material layer was used for the base material layer as shown in Tables 2-1 and 2-2.

(3) Measurement of Physical Properties of Mold Release Film

Using the obtained mold release film, the following measurement and evaluation were performed. Tables 2-1 and 2-2 show the results.

(a) Surface Roughness Ra of Surface on Mold Release Layer of Mold Release Film

Measurement was performed in accordance with JIS B 0601:2013.

(b) Value Measured by Loop Stiffness Test

Using a loop stiffness tester (manufactured by Toyo Seiki Seisaku-sho, Ltd.), the stiffness strength was measured over time under the condition of a test piece size: 25 mm×110 mm (machine direction when forming the mold release film), a loop length: 62 mm, and a pressing amount: 5 mm. A maximum value thereof was taken as a "value measured by the loop stiffness test" (mN/cm).

(c) Rate of Dimensional Change (%) at 180° C. when Temperature was Raised from 30° C. To 180° C. At Rate of 2° C./Minute with Tensile Load of 500 mN by Thermomechanical Analysis (TMA)

Measurement was performed using TMA7100 (manufactured by Hitachi High-Tech Corporation).

(d) Storage Elastic Modulus (MPa) at 180° C. When Dynamic Viscoelasticity (DMA) was Measured Under Condition of Temperature Rising Rate of 5° C./Minute and Frequency of 1 Hz Measurement was performed according to JIS K 7244: 1998.

(4) Production of Molded Body

Resin sealing was performed using the obtained mold release film to obtain a molded body.

First, the following granular thermosetting resin composition was produced as a resin for sealing.

(Materials)

Epoxy resin 1: biphenyl aralkyl type epoxy resin (manufactured by Nippon Kayaku Co., Ltd., NC-3000)

Epoxy resin 2: biphenyl type epoxy resin (manufactured by Mitsubishi Chemical Corporation, YL6677)

Curing agent 1: biphenylene skeleton-containing phenol aralkyl resin (manufactured by Nippon Kayaku Co., Ltd., GPH-65)

Curing agent 2: triphenylmethane type phenolic resin modified with formaldehyde (manufactured by AIR WATER INC., HE910-20)

Curing accelerator: triphenylphosphine (manufactured by HOKKO CHEMICAL INDUSTRY CO., LTD., TPP)

Inorganic filler: fused spherical silica (manufactured by Denki Kagaku Kogyo Co., Ltd., FB-950FC)

Coloring agent: carbon black (Mitsubishi Chemical Corporation, MA-600)

Coupling agent: N-phenyl-γ-aminopropyltrimethoxysilane (manufactured by Shin-Etsu Chemical Co., Ltd., KBM-573)

Mold release agent: carnauba wax (manufactured by Nikko Fine Co., Ltd., Nikko Carnauba)

(Procedure)

4.5 parts by mass of the epoxy resin 1, 4.5 parts by mass of the epoxy resin 2, 2.8 parts by mass of the curing agent 1, 2.8 parts by mass of the curing agent 2, 0.4 parts by mass of the curing accelerator, 84.2 parts by mass of the inorganic filler, 0.2 parts by mass of the coloring agent, 0.4 parts by mass of the coupling agent, and 0.2 parts by mass of the mold release agent, all of which were described above, were prepared. Next, after mixing each of the raw material components at room temperature using a mixer, the mixture was roll kneaded while being heated with two rolls at 45° C. and 90° C. to obtain a kneaded material. Next, the above-mentioned kneaded material was cooled and thereafter ground, and thereby a granular thermosetting resin composition was obtained.

Next, using each mold release film, curing (resin sealing) of the thermosetting resin composition was performed in the following procedure to obtain a molded body.

(Procedure)

First, five 7.5-millimeter square semiconductor elements having a thickness of 0.3 mm were adhered on an organic substrate having a thickness of 0.4 mm, a width of 65 mm, and a length of 190 mm with a silver paste, and a gold wire having a diameter of 18 μm and a length of 7 mm was bonded with a pitch spacing of 60 μm. Next, the metal mold temperature of a compression molding machine (manufactured by TOWA CORPORATION, PMC1040) was preliminarily set to 175° C. Next, the organic substrate was fixed to an upper metal mold such that the surface on which the semiconductor elements were mounted faced a lower metal mold. Next, the mold release film created in each of the examples and comparative examples was disposed on the lower metal mold such that the second base material layer side of the mold release film was on the lower metal mold side. Thereafter, the space inside the metal mold was evacuated, thereby causing the mold release film to follow the lower metal mold. Thereafter, the granular thermosetting resin composition (resin composition for sealing) prepared on the mold release film was uniformly supplied. Next, immediately after supplying the resin composition for sealing, the metal mold was clamped until the space between the organic substrate and the mold release film was 4 mm, and at the same time, the pressure inside the cavity formed because of the lower metal mold and the upper metal mold was reduced to a degree of pressure reduction of 0.8 Torr in 4 seconds. Thereafter, while continuing to reduce the pressure, the metal mold was completely clamped in 12 seconds to perform sealing molding under the condition of a molding pressure of 3.9 MPa and a curing time of 90 seconds, thereby obtaining a molded body (cured substance).

(5) Evaluation of Mold Release Film

Each of the mold release films was evaluated as follows. Tables 2-1 and 2-2 show the results.

[Mold Followability]

The amount of dead air spaces between the metal mold and the mold release film when the mold release film was caused to follow the metal mold by evacuation in the above-mentioned procedure was evaluated according to the following criteria.

⊙: no dead air spaces were generated.

○: there was a small amount of dead air spaces, which did not cause practical problems.

Δ: there was a small amount of dead air spaces, which lowered the degree of vacuum for film adsorption.

x: there was a large amount of dead air spaces, which made following poor (or made evaluation impossible).

[Dimensional Stability]

The external appearance state (wrinkles and the like) of the cured substance after releasing the cured substance from the mold release film after molding in the above-mentioned procedure was evaluated according to the following criteria.

○: there were no wrinkles or deformation, which caused no problems.

Δ: there were some wrinkles, which did not cause practical problems.

x: there was a large amount of wrinkles, which made molding poor.

[Mold Releasability]

The mold release behavior and the state of the cured substance (misalignment, bending, and the like) when the cured substance was released from the molded release film after molding in the above-mentioned procedure were evaluated according to the following criteria.

○: no problem in both mold releasability and the molded body.

Δ: the molded body was misaligned or bent when being released from the mold, which did not cause practical problems.

x: mold releasing was impossible, or the molded body was greatly misaligned or bent.

[Workability]

The state of the mold release film when the film was disposed in the molding machine in the above-mentioned procedure was evaluated according to the following criteria.

○: there were no wrinkles or folding on the film during handling, which caused no problems.

Δ: the film bent during handling, which did not cause practical problems.

x: there were wrinkles or folding on the film during handling, which caused deformation.

TABLE 2-1

| | | | First experiment | | | | | | | | | |
|---|---|---|---|---|---|---|---|---|---|---|---|---|
| | | Unit | Example 1 | Example 2 | Example 3 | Example 4 | Example 5 | Example 6 | Example 7 | Example 8 | Example 9 | Example 10 |
| First base material layer | Material | — | OPBT | OPBT | OPBT | OPBT | OPBT | CPBT | OPET1 | OPP | ONy | CNy |
| | Thickness | μm | 15 | 15 | 15 | 15 | 15 | 25 | 13 | 40 | 15 | 25 |
| Second base material layer | Material | — | CPBT | CPBT | CPBT | CPBT | CPBT | OPBT | CPBT | OPBT | OPBT | OPBT |
| | Thickness | μm | 25 | 25 | 25 | 25 | 35 | 15 | 25 | 15 | 15 | 15 |
| Mold release layer | Material | — | Melamine | Acryl | Silicone | Silicone | Melamine | Melamine | Melamine | Melamine | Melamine | Melamine |
| | Thickness | μm | 0.2 | 0.2 | 20 | 20 | 30 | 1 | 1 | 5 | 5 | 1 |
| Characteristics | (a) Surface roughness Ra | μm | 0.12 | 0.11 | 0.37 | 1.71 | 0.14 | 0.13 | 0.14 | 0.12 | 0.12 | 0.11 |
| | (b) Loop stiffness | mN/cm | 17 | 15 | 10 | 10 | 33 | 15 | 9 | 48 | 13 | 20 |
| | (c) Rate of dimensional change at 180° C. | % | 11 | 9 | 10 | 10 | 10 | 11 | 25 | 13 | 5 | 14 |
| | (d) Storage elastic modulus at 180° C. | MPa | 229 | 230 | 179 | 179 | 106 | 258 | 176 | 29 | 391 | 118 |
| Evaluation | Mold followability | | ○ | ○ | ○ | ○ | ○ | ○ | ⊙ | ⊙ | Δ | ⊙ |
| | Dimensional stability | | ○ | ○ | ○ | ○ | ○ | ○ | ○ | Δ | Δ | Δ |
| | Mold releasability | | ○ | ○ | ○ | ○ | ○ | ○ | ○ | ○ | ○ | ○ |
| | Workability | | ○ | ○ | ○ | ○ | ○ | ○ | Δ | ○ | ○ | ○ |

TABLE 2-2

| First experiment | | | | | |
|---|---|---|---|---|---|
| | | Unit | Comparative Example 1 | Comparative Example 2 | Comparative Example 3 |
| First base material layer | Material | — | OPBT | OPBT | OPET2 |
| | Thickness | μm | 15 | 20 | 50 |
| Second base material layer | Material | — | — | — | — |
| | Thickness | μm | | | |
| Mold release layer | Material | — | Melamine | Melamine | Melamine |
| | Thickness | μm | 0.2 | 0.2 | 0.2 |
| | (a) Surface roughness Ra | μm | 0.11 | 0.10 | 0.10 |
| Characteristics | (b) Loop stiffness | mN/cm | 0.35 | 1.1 | 37 |
| | (c) Rate of dimensional change at 180° C. | % | 14 | 7 | 2 |
| | (d) Storage elastic modulus at 180° C. | MPa | 290 | 310 | 886 |
| Evaluation | Mold followability | | ⊙ | Δ | X |
| | Dimensional stability | | ○ | Δ | — |
| | Mold releasability | | ○ | ○ | — |
| | Workability | | X | X | ○ |

Second Experiment (1) Raw Materials

Raw material components used in the examples and the comparative examples and shown in Table 3 are described below.

(Vinyl Group-Containing Organopolysiloxane (A))

Vinyl group-containing linear organopolysiloxane (A1-1) in which the content of vinyl groups is low (hereinafter also referred to as "low-vinyl group-containing linear organopolysiloxane"): vinyl group-containing dimethylpolysiloxane synthesized according to Synthesis Scheme 1 (a structure which is represented by Formula (1-1) and in which only $R^1$ (terminal) is a vinyl group).

Vinyl group-containing linear organopolysiloxane (A1-2) in which the content of vinyl groups is high (hereinafter also referred to as "high-vinyl group-containing linear organopolysiloxane"): vinyl group-containing dimethylpolysiloxane synthesized according to Synthesis Scheme 2 (a structure which is represented by Formula (1-1) and in which $R^1$ and $R^2$ are each a vinyl group).

(Organohydrogenpolysiloxane (B))

Manufactured by Momentive: "TC-25D"

(Inorganic Filler)

Inorganic filler (C): silica fine particles (particle diameter 7 nm, specific surface area 300 $m^2/g$), "AEROSIL 300" manufactured by Nippon Aerosil Co., Ltd.

(Silane Coupling Agent)

Silane coupling agent (D-1): hexamethyldisilazane (HMDZ), "HEXAMETHYLDISILAZANE (SIH 6110.1)" manufactured by Gelest.

Silane coupling agent (D-2): divinyltetramethyldisilazane, "1,3-DIVINYLTETRAMETHYLDISILAZANE (SID 4612.0)" manufactured by Gelest.

(Platinum or Platinum Compound (E))

Manufactured by Momentive: "TC-25A"

(Synthesis of Vinyl Group-Containing Organopolysiloxane (A))

[Synthesis Scheme 1: Synthesis of Low-Vinyl Group-Containing Linear Organopolysiloxane (A1-1)]

The low-vinyl group-containing linear organopolysiloxane (A1-1) was synthesized according to Formula (5) of the above-mentioned first experiment.

That is, 74.7 g (252 mmol) of octamethylcyclotetrasiloxane and 0.1 g of potassium siliconate were put in a 300 mL separable flask which had a cooling pipe and a stirring blade and which had been replaced with Ar gas. A temperature was raised, and stirring was performed at 120° C. for 30 minutes. At this time, an increase in viscosity could be confirmed.

Thereafter, the temperature was raised to 155° C., and stirring was continued for 3 hours. Then, after 3 hours, 0.1 g (0.6 mmol) of 1,3-divinyltetramethyldisiloxane was added, and stirring was further performed at 155° C. for 4 hours.

Furthermore, after 4 hours, dilution with 250 mL of toluene was performed, and washing with water was performed 3 times thereafter. The washed organic layer was washed several times with 1.5 L of methanol to reprecipitate and to be purified, and the oligomer and the polymer were separated. The obtained polymer was dried under reduced pressure at 60° C. overnight to obtain the low-vinyl group-containing linear organopolysiloxane (A1-1) ($Mn=2.2\times10^5$, $Mw=4.8\times10^5$). In addition, the content of vinyl groups calculated by H-NMR spectrum measurement was 0.04 mol %.

[Synthesis Scheme 2: Synthesis of High-Vinyl Group-Containing Linear Organopolysiloxane (A1-2)]

The high-vinyl group-containing linear organopolysiloxane (A1-2) ($Mn=2.3\times10^5$, $Mw=5.0\times10^5$) was synthesized as shown in Formula (6) of the first experiment by the same synthesis step for (A1-1) except that 0.86 g (2.5 mmol) of 2,4,6,8-tetramethyl-2,4,6,8-tetravinylcyclotetrasiloxane was used in addition to 74.7 g (252 mmol) of octamethylcyclotetrasiloxane in the above-mentioned synthesis step for (A1-1). In addition, the content of vinyl groups calculated by H-NMR spectrum measurement was 0.92 mol %.

(2) Preparation of First Resin Composition (Preparation of Mold Release Layer)

Each first resin composition was prepared as follows.

First, a mixture of 90% of the vinyl group-containing organopolysiloxane (A), the silane coupling agent, and water (F) was pre-kneaded in a ratio shown in Table 3 below. Thereafter, the inorganic filler was added to the mixture and further kneaded to obtain a kneaded material (silicone rubber compound).

Kneading after the addition of the inorganic filler was performed through a first step of kneading for 1 hour under the condition of 60° C. to 90° C. under a nitrogen atmosphere for a coupling reaction, and a second step of kneading for 2 hours under the condition of 160° C. to 180° C. under a reduced pressure atmosphere for removing by-products (ammonia). Thereafter, cooling was performed, and the remaining 10% of the vinyl group-containing organopolysiloxane (A) was added in two portions and kneaded for 20 minutes.

Subsequently, the organohydrogenpolysiloxane (B) (TC-25D) and the platinum or platinum compound (E) (TC-25A) were added to 100 parts by weight of the obtained kneaded material (silicone rubber compound) in a ratio shown in Table 3 below, and were kneaded with a roll to obtain each first resin composition.

TABLE 3

| | | | | Unit | First resin composition<br>Composition (1) | <br>Composition (2) | <br>Composition (3) |
|---|---|---|---|---|---|---|---|
| Silicone rubber composition | Kneaded material | Vinyl group-containing organopolysiloxane (A) | (A1-1) | Part by weight | 80 | 80 | 80 |
| | | | (A1-2) | | 20 | 20 | 20 |
| | | Inorganic filler | (C) | | 25 | 35 | 5 |
| | | Silane coupling agent | (D-1) | | 10.0 | 9.8 | 2.0 |
| | | | (D-2) | | 0.5 | 0.7 | 0.1 |
| | | Water | | | 5.3 | 5.3 | 5.3 |
| | Additive | Organohydrogenpolysiloxane (B) | | Parts by weight with respect to 100 parts by weight of kneaded material | 5.3 | 4.5 | 2.3 |
| | | Platinum or platinum compound | | | 0.5 | 0.5 | 0.5 |

(3) Creation of Mold Release Film Having Base Material Layer

Each mold release film of examples and comparative examples of the second experiment were produced in the following manner.

Example 1

A 15 μm-thick biaxially oriented polybutylene terephthalate (OPBT1: manufactured by TOYOBO CO., LTD., TOYOBOESTER (registered trademark) film, DE048) was used as a base material layer as shown in Tables 4-1 and 4-2. The base material layer was coated with a paste (solid content: 25 mass %, solvent: decane) composed of the first resin composition prepared in (2) mentioned above using a bar coater, and curing was performed at 180° C. for 120 minutes, thereby obtaining a mold release film having a mold release layer on the base material layer. The thickness of the mold release layer of the obtained mold release film was 35 μm, and the surface roughness Rz of the mold release surface of the mold release layer was 0.1 μm.

Example 2

A mold release film was created in the same manner as in Example 1 except that as shown in Tables 4-1 and 4-2, embossing processing was performed on the surface of the mold release layer by sandwiching the matte film in the film formation step in which the paste composed of the first resin composition was used.

Example 3

A mold release film was created in the same manner as in Example 1 except that the thickness of the mold release layer was changed to 10 μm as shown in Tables 4-1 and 4-2.

Example 4

A mold release film was created in the same manner as in Example 1 except that the thickness of the mold release layer was changed to 70 μm as shown in Tables 4-1 and 4-2.

Example 5

A mold release film was created in the same manner as in Example 1 except that as shown in Tables 4-1 and 4-2, the first resin composition used for forming the mold release layer was changed to the composition shown in Tables 2-1 and 2-2.

Example 6

A mold release film was created in the same manner as in Example 1 except that the base material layer was changed to a 20 μm-thick biaxially oriented polybutylene terephthalate (OPET2: manufactured by KOHJIN Film & Chemicals Co., Ltd., BOBLET ST20), and the thickness of the mold release layer was changed to 30 μm, as shown in Tables 4-1 and 4-2.

Example 7

A mold release film was created in the same manner as in Example 1 except that the base material layer was changed to a 9 μm-thick biaxially oriented polyethylene terephthalate (OPET1: manufactured by TOYOBO CO., LTD., TOYOBOESTER (registered trademark) film), and the thickness of the mold release layer was changed to 41 μm, as shown in Tables 4-1 and 4-2.

Example 8

A mold release film was created in the same manner as in Example 1 except that the base material layer was changed to a 12 μm-thick biaxially oriented polyethylene terephthalate (manufactured by TOYOBO CO., LTD., TOYOBOESTER (registered trademark) film), and the thickness of the mold release layer was changed to 38 μm, as shown in Tables 4-1 and 4-2.

Example 9

A mold release film was created in the same manner as in Example 1 except that the base material layer was changed to a 13 μm-thick biaxially oriented polyethylene terephthalate (OPET2: manufactured by Toyobo Film Solution Ltd., TEFLEX (registered trademark) film FW2), and the thickness of the mold release layer was changed to 37 μm, as shown in Tables 4-1 and 4-2.

Comparative Example 1

A mold release film was created in the same manner as in Example 1 except that as shown in Tables 4-1 and 4-2, the first resin composition used for forming the mold release layer was changed to the composition shown in Tables 2-1 and 2-2.

Comparative Example 2

A mold release film was created in the same manner as in Example 1 except that the base material layer was changed to a 19 μm-thick biaxially oriented polyethylene terephthalate (OPET1: manufactured by TOYOBO CO., LTD., TOYOBOESTER (registered trademark) film), and the thickness of the mold release layer was changed to 31 μm, as shown in Tables 4-1 and 4-2.

Comparative Example 3

A mold release film was created in the same manner as in Example 1 except that the base material layer was changed to a film (35 μm thick) produced using a poly-4-methyl-1-pentene resin (manufactured by Mitsui Chemicals, Inc., TPX RT31) as shown in Tables 4-1 and 4-2.

Comparative Example 4

A mold release film was created in the same manner as in Example 1 except that the base material layer was changed to a film (25 μm thick) produced using a polybutylene terephthalate elastomer resin (manufactured by DU PONT-TORAY CO., LTD., Hytrel 6347), and the thickness of the mold release layer was changed to 25 μm, as shown in Tables 4-1 and 4-2.

(4) Measurement and Evaluation

Using the obtained mold release film, the following measurement and evaluation were performed. Tables 4-1 and 4-2 show the results.

(a) The 5% tensile strength (5% modulus) of the mold release film at 180° C. was calculated from the S—S curve obtained by measurement according to a tensile test JIS K 7127.

(b) The breaking strength X1 (MPa) at 25° C. and the breaking strength X2 (MPa) at 180° C. were measured according to JIS K 7127. The obtained X1 and X2 were applied to the following equation to obtain α1.

$$\alpha 1=((1-(X1-X2)/X1))$$

(c) The Young's modulus of the mold release film 11 at 180° C. was measured according to JIS K 7127.

(d) The rate (%) of dimensional change of the mold release film when the temperature was raised from 30° C. to 250° C. at 2° C./minute with a tensile load of 500 mN according to thermomechanical analysis (TMA) was measured using TMA7100 (manufactured by Hitachi High-Tech Corporation).

(i) Measurement of Surface Roughness Rz of Mold Release Surface of Mold Release Film Measurement was performed in accordance with JIS B 0601:2013.

(ii) Evaluation of External Appearance of Molded Body

First, the following granular thermosetting resin composition was produced as a resin for sealing.

(Materials)

Epoxy resin 1: biphenyl aralkyl type epoxy resin (manufactured by Nippon Kayaku Co., Ltd., NC-3000)

Epoxy resin 2: biphenyl type epoxy resin (manufactured by Mitsubishi Chemical Corporation, YL6677)

Curing agent 1: biphenylene skeleton-containing phenol aralkyl resin (manufactured by Nippon Kayaku Co., Ltd., GPH-65)

Curing agent 2: triphenylmethane type phenolic resin modified with formaldehyde (manufactured by AIR WATER INC., HE910-20)

Curing accelerator: triphenylphosphine (manufactured by HOKKO CHEMICAL INDUSTRY CO., LTD., TPP)

Inorganic filler: fused spherical silica (manufactured by Denki Kagaku Kogyo Co., Ltd., FB-950FC)

Coloring agent: carbon black (Mitsubishi Chemical Corporation, MA-600)

Coupling agent: N-phenyl-γ-aminopropyltrimethoxysilane (manufactured by Shin-Etsu Chemical Co., Ltd., KBM-573)

Mold release agent: carnauba wax (manufactured by Nikko Fine Co., Ltd., Nikko Carnauba)

(Procedure)

4.5 parts by mass of the epoxy resin 1, 4.5 parts by mass of the epoxy resin 2, 2.8 parts by mass of the curing agent 1, 2.8 parts by mass of the curing agent 2, 0.4 parts by mass of the curing accelerator, 84.2 parts by mass of the inorganic filler, 0.2 parts by mass of the coloring agent, 0.4 parts by mass of the coupling agent, and 0.2 parts by mass of the mold release agent, all of which were described above, were prepared. Next, after mixing each of the raw material components at room temperature using a mixer, the mixture was roll kneaded while being heated with two rolls at 45° C. and 90° C. to obtain a kneaded material. Next, the above-mentioned kneaded material was cooled and thereafter ground, and thereby a granular thermosetting resin composition was obtained.

Next, using each mold release film, curing (resin sealing) of the thermosetting resin composition was performed in the following procedure.

First, five 7.5-millimeter square semiconductor elements having a thickness of 0.3 mm were adhered on an organic substrate having a thickness of 0.4 mm, a width of 65 mm, and a length of 190 mm with a silver paste, and a gold wire having a diameter of 18 μm and a length of 7 mm was bonded with a pitch spacing of 60 μm. Next, the metal mold temperature of a compression molding machine (manufactured by TOWA CORPORATION, PMC1040) was preliminarily set to 175° C. Next, the organic substrate was fixed to an upper metal mold such that the surface on which the semiconductor elements were mounted faced a lower metal mold. Next, the mold release film created in each of the examples and comparative examples was disposed on the lower metal mold. Thereafter, the space inside the metal mold was evacuated, thereby causing the mold release film to follow the metal mold. Thereafter, the granular thermosetting resin composition (resin composition for sealing) prepared on the mold release film was uniformly supplied. Next, immediately after supplying the resin composition for sealing, the metal mold was clamped until the space between the organic substrate and the mold release film was 4 mm, and at the same time, the pressure inside the cavity formed because of the lower metal mold and the upper metal mold was reduced to a degree of pressure reduction of 0.8 Torr in 4 seconds. Thereafter, while continuing to reduce the pressure, the metal mold was completely clamped in 12 seconds to perform sealing molding under the condition of a molding pressure of 3.9 MPa and a curing time of 90 seconds.

(iii) Evaluation of Mold Release Film

[Mold Followability]

The amount of dead air spaces between the metal mold and the mold release film when the mold release film was caused to follow the metal mold by evacuation in the above-mentioned procedure was evaluated according to the following criteria.

⊙: no dead air spaces were generated.

○: there was a small amount of dead air spaces, which did not cause practical problems.

Δ: there was a small amount of dead air spaces, which lowered the degree of vacuum for film adsorption.

x: there was a large amount of dead air spaces, which made following poor (or made evaluation impossible).

[Dimensional Stability]

The external appearance state (wrinkles and the like) of the cured substance after releasing the cured substance from the mold release film after molding in the above-mentioned procedure was evaluated according to the following criteria.

○: there were no wrinkles or deformation, which caused no problems.

Δ: there were some wrinkles, which did not cause practical problems.

x: there was a large amount of wrinkles, which made molding poor.

[Mold Releasability]

The mold release behavior and the state of the cured substance (misalignment, bending, and the like) when the cured substance was released from the molded release film after molding in the above-mentioned procedure were evaluated according to the following criteria.

○: no problem in both mold releasing and the molded product.

Δ: the molded product was misaligned or bent when being released from the mold, which did not cause practical problems.

x: mold releasing was impossible, or the molded product was greatly misaligned or bent.

[Interlayer Strength]

The state of the mold release layer when the cured substance was released from the molded release film after molding in the above-mentioned procedure was evaluated according to the following criteria.

○: there was no peeling of the mold release layer, which caused no problems.

Δ: a part of the mold release layer came off from the base material layer, which did not cause practical problems.

x: large sections of the mold release layer were peeled off from the base material layer.

TABLE 4-1

| Second experiment | | | | | | | | | | | |
|---|---|---|---|---|---|---|---|---|---|---|---|
| | | Unit | Example 1 | Example 2 | Example 3 | Example 4 | Example 5 | Example 6 | Example 7 | Example 8 | Example 9 |
| Base material layer | Material | | OPBT (1) | | | | | OPBT (2) | OPET (1) | | OPET (2) |
| | Thickness | μm | | | 15 | | | 20 | 9 | 12 | 13 |
| Mold release layer | Material | | Composition (1) | | | | Composition (2) | Composition (1) | | | |
| | Surface roughness Rz | μm | 0.1 | 6.3 | 0.1 | | | | | | |
| | Thickness | μm | 35 | | 10 | 70 | 35 | 30 | 41 | 38. | 37 |
| Mold release film | (a) 5% Tensile strength at 180° C. | MPa | 1.9 | 1.8 | 3.6 | 1.2 | 2.0 | 2.2 | 2.6 | 4.8 | 2.1 |
| | (b) Breaking strength X1 at 25° C. | MPa | 56 | 51 | 119 | 41 | 59 | 57 | 30 | 44 | 30 |
| | Breaking strength X2 at 180° C. | MPa | 16 | 18 | 51 | 9 | 18 | 22 | 17 | 24 | 22 |
| | α1 = ((1 − (X1 − X2)/X1)) | MPa | 0.29 | 0.35 | 0.43 | 0.22 | 0.31 | 0.39 | 0.57 | 0.55 | 0.73 |
| | (c) Young's modulus at 180° C. | MPa | 64 | 58 | 93 | 35 | 62 | 70 | 86 | 95 | 69 |
| | (d) Rate of dimensional change | | 12 | 13 | 16 | 10 | 14 | 11 | 8.8 | 5 | 25 |
| Evaluation | Mold followability | | ⊙ | ⊙ | ⊙ | ⊙ | ⊙ | ○ | ○ | Δ | ○ |
| | Dimensional stability | | ○ | ○ | ○ | ○ | ○ | ○ | ○ | ○ | ○ |
| | Mold releasability | | ○ | ○ | ○ | ○ | ○ | ○ | ○ | ○ | ○ |
| | Interlayer strength | | ○ | ○ | ○ | ○ | ○ | ○ | ○ | ○ | ○ |

TABLE 4-2

| Second experiment | | | | | | | |
|---|---|---|---|---|---|---|---|
| | | | Unit | Comparative Example 1 | Comparative Example 2 | Comparative Example 3 | Comparative Example 4 |
| Base material layer | Material | | | OPBT (1) | OPET (1) | TPX | PBT |
| | Thickness | | μm | 15 | 19 | 35 | 25 |
| Mold release layer | Material | | | Composition (3) | | Composition (1) | |
| | Surface roughness Rz | | μm | 0.1 | | | |
| | Thickness | | μm | 35 | 31 | 15 | 25 |
| Mold release film | (a) | 5% Tensile strength at 180° C. | MPa | 1.1 | 7.4 | 0.6 | 0.9 |
| | (b) | Breaking strength X1 at 25° C. | MPa | 58 | 78 | 27 | 45 |
| | | Breaking strength X2 at 180° C. | MPa | 11 | 65 | 3.2 | 8.7 |
| | | α1 = ((1 − (X1 − X2)/X1)) | MPa | 0.19 | 0.83 | 0.12 | 0.19 |
| | (c) | Young's modulus at 180° C. | MPa | 33 | 148 | 20 | 35 |
| | (d) | Rate of dimensional change | % | 15 | 2 | >55 | >55 |
| Evaual-tion | Mold followability | | | ⊙ | X | ⊙ | ⊙ |
| | Dimensional stability | | | Δ | X | X | X |
| | Mold releasability | | | X | Δ | Δ | Δ |
| | Interlayer strength | | | Δ | ○ | X | ○ |

Third Experiment (1) Raw Materials

Raw material components used in the examples and the comparative examples and shown in Table 5 are described below.

(Vinyl Group-Containing Organopolysiloxane (A))

Vinyl group-containing linear organopolysiloxane (A1-1) in which the content of vinyl groups is low (hereinafter also referred to as "low-vinyl group-containing linear organopolysiloxane"): vinyl group-containing dimethylpolysiloxane synthesized according to Synthesis Scheme 1 (a structure which is represented by Formula (1-1) and in which only $R^1$ (terminal) is a vinyl group).

Vinyl group-containing linear organopolysiloxane (A1-2) in which the content of vinyl groups is high (hereinafter also referred to as "high-vinyl group-containing linear organopolysiloxane"): vinyl group-containing dimethylpolysiloxane synthesized according to Synthesis Scheme 2 (a structure which is represented by Formula (1-1) and in which $R^1$ and $R^2$ are each a vinyl group).

(Organohydrogenpolysiloxane (B))

Manufactured by Momentive: "TC-25D"

(Inorganic Filler)

Inorganic filler (C): silica fine particles (particle diameter 7 nm, specific surface area 300 $m^2/g$), "AEROSIL 300" manufactured by Nippon Aerosil Co., Ltd.

(Silane Coupling Agent)

Silane coupling agent (D-1): hexamethyldisilazane (HMDZ), "HEXAMETHYLDISILAZANE (SIH 6110.1)" manufactured by Gelest.

Silane coupling agent (D-2): divinyltetramethyldisilazane, "1,3-DIVINYLTETRAMETHYLDISILAZANE (SID 4612.0)" manufactured by Gelest.

(Platinum or Platinum Compound (E))

Manufactured by Momentive: "TC-25A"

(Synthesis of Vinyl Group-Containing Organopolysiloxane (A))

[Synthesis Scheme 1: Synthesis of Low-Vinyl Group-Containing Linear Organopolysiloxane (A1-1]

The low-vinyl group-containing linear organopolysiloxane (A1-1) was synthesized according to Formula (5) of the above-mentioned first experiment.

That is, 74.7 g (252 mmol) of octamethylcyclotetrasiloxane and 0.1 g of potassium siliconate were put in a 300 mL separable flask which had a cooling pipe and a stirring blade and which had been replaced with Ar gas. A temperature was raised, and stirring was performed at 120° C. for 30 minutes. At this time, an increase in viscosity could be confirmed.

Thereafter, the temperature was raised to 155° C., and stirring was continued for 3 hours. Ther, after 3 hours, 0.1 g (0.6 mmol) of 1,3-divinyltetramethyldisiloxane was added, and stirring was further performed at 155° C. for 4 hours.

Furthermore, after 4 hours, dilution with 250 mL of toluene was performed, and washing with water was performed 3 times thereafter. The washed organic layer was washed several times with 1.5 L of methanol to reprecipitate and to be purified, and the oligomer and the polymer were separated. The obtained polymer was dried under reduced pressure at 60° C. overnight to obtain the low-vinyl group-containing linear organopolysiloxane (A1-1) (Mn=$2.2\times10^5$, Mw=$4.8\times10^5$). In addition, the content of vinyl groups calculated by H-NMR spectrum measurement was 0.04 mol %.

[Synthesis Scheme 2: Synthesis of High-Vinyl Group-Containing Linear Organopolysiloxane (A1-2)]

The high-vinyl group-containing linear organopolysiloxane (A1-2) (Mn=$2.3\times10^5$, Mw=$5.0\times10^5$) was synthesized as shown in Formula (6) of the first experiment by the same synthesis step for (A1-1) except that 0.86 g (2.5 mmol) of 2,4,6,8-tetramethyl-2,4,6,8-tetravinylcyclotetrasiloxane was used in addition to 74.7 g (252 mmol) of octamethylcyclotetrasiloxane in the above-mentioned synthesis step for (A1-1). In addition, the content of vinyl groups calculated by H-NMR spectrum measurement was 0.93 mol %.

(2) Preparation of First Resin Composition (Preparation of Mold Release Layer)

Each first resin composition was prepared as follows.

First, a mixture of 90% of the vinyl group-containing organopolysiloxane (A), the silane coupling agent, and water (F) was pre-kneaded in a ratio shown in Table 5 below. Thereafter, the inorganic filler was added to the mixture and further kneaded to obtain a kneaded material (silicone rubber compound).

Kneading after the addition of the inorganic filler was performed through a first step of kneading for 1 hour under the condition of 60° C. to 90° C. under a nitrogen atmosphere for a coupling reaction, and a second step of kneading for 2 hours under the condition of 160° C. to 180° C. under a reduced pressure atmosphere for removing by-products (ammonia). Thereafter, cooling was performed, and the remaining 10% of the vinyl group-containing organopolysiloxane (A) was added in two portions and kneaded for 20 minutes.

Subsequently, the organohydrogenpolysiloxane (B) (TC-25D) and the platinum or platinum compound (E) (TC-25A) were added to 100 parts by weight of the obtained kneaded material (silicone rubber compound) in a ratio shown in Table 5 below, and were kneaded with a roll to obtain each first resin composition.

TABLE 5

| | | | | Unit | First resin composition | | |
|---|---|---|---|---|---|---|---|
| | | | | | Composition (1) | Composition (2) | Composition (3) |
| Silicone rubber composition | Kneaded material | Vinyl group-containing organopolysiloxane (A) | (A1-1) | Part by weight | 80 | 80 | 80 |
| | | | (A1-2) | | 20 | 20 | 20 |
| | | Inorganic filler | (C) | | 25 | 35 | 5 |
| | | Silane coupling agent | (D-1) | | 10.0 | 9.8 | 2.0 |
| | | | (D-2) | | 0.5 | 0.7 | 0.1 |
| | | Water | | | 5.3 | 5.3 | 5.3 |
| | Additive | Organohydrogenpolysiloxane (B) | | Parts by weight with respect to 100 parts by weight of kneaded material | 5.3 | 4.5 | 2.3 |
| | | Platinum or platinum compound | | | 0.5 | 0.5 | 0.5 |

(3) Creation of Mold Release Film Having Base Material Layer

Each mold release film of examples and comparative examples of the third experiment were produced in the following manner.

Example 1

A 15 μm-thick biaxially oriented polybutylene terephthalate (OPBT1: manufactured by TOYOBO CO., LTD., TOYOBOESTER (registered trademark) film, DE048) was used as a base material layer as shown in Tables 6-1 and 6-2. The base material layer was coated with a paste (solid content: 25 mass %, solvent: decane) composed of the first resin composition prepared in (2) mentioned above using a bar coater, and curing was performed at 180° C. for 120 minutes, thereby obtaining a mold release film having a mold release layer on the base material layer. The thickness of the mold release layer of the obtained mold release film was 35 μm, and the surface roughness Rz of the mold release surface of the mold release layer was 0.1 μm.

Example 2

A mold release film was created in the same manner as in Example 1 except that as shown in Tables 6-1 and 6-2, embossing processing was performed on the surface of the mold release layer by sandwiching the matte film in the film formation step in which the paste composed of the first resin composition was used.

Example 3

A mold release film was created in the same manner as in Example 1 except that the thickness of the mold release layer was changed to 10 μm as shown in Tables 6-1 and 6-2.

Example 4

A mold release film was created in the same manner as in Example 1 except that the thickness of the mold release layer was changed to 70 μm as shown in Tables 6-1 and 6-2.

Example 5

A mold release film was created in the same manner as in Example 1 except that as shown in Tables 6-1 and 6-2, the first resin composition used for forming the mold release layer was changed to the composition shown in Tables 2-1 and 2-2.

Example 6

A mold release film was created in the same manner as in Example 1 except that the base material layer was changed to a 20 μm-thick biaxially oriented polybutylene terephthalate (OPET2: manufactured by KOHJIN Film & Chemicals Co., Ltd., BOBLET ST20), and the thickness of the mold release layer was changed to 30 μm, as shown in Tables 6-1 and 6-2.

Example 7

A mold release film was created in the same manner as in Example 1 except that the base material layer was changed to a 9 μm-thick biaxially oriented polyethylene terephthalate (OPET1: manufactured by TOYOBO CO., LTD., TOYOBOESTER (registered trademark) film), and the thickness of the mold release layer was changed to 41 μm, as shown in Tables 6-1 and 6-2.

Example 8

A mold release film was created in the same manner as in Example 1 except that the base material layer was changed to a 12 μm-thick biaxially oriented polyethylene terephthalate. (manufactured by TOYOBO CO., LTD., TOYOBOESTER (registered trademark) film), and the thickness of the mold release layer was changed to 38 μm, as shown in Tables 6-1 and 6-2.

Example 9

A mold release film was created in the same manner as in Example 1 except that the base material layer was changed to a 13 μm-thick biaxially oriented polyethylene terephthalate (OPET2: manufactured by Toyobo Film Solution Ltd., TEFLEX (registered trademark) film FW2), and the thickness of the mold release layer was changed to 37 μm, as shown in Tables 6-1 and 6-2.

Comparative Example 1

A mold release film was created in the same manner as in Example 1 except that as shown in Tables 6-1 and 6-2, the first resin composition used for forming the mold release layer was changed to the composition shown in Tables 2-1 and 2-2.

Comparative Example 2

A mold release film was created in the same manner as in Example 1 except that the base material layer was changed to a 19 μm-thick biaxially oriented polyethylene terephthalate (OPET1: manufactured by TOYOBO CO., LTD., TOYOBOESTER (registered trademark) film), and the thickness of the mold release layer was changed to 31 μm, as shown in Tables 6-1 and 6-2.

Comparative Example 3

A mold release film was created in the same manner as in Example 1 except that the base material layer was changed to a film (35 μm thick) produced using a poly-4-methyl-1-pentene resin (manufactured by Mitsui Chemicals, Inc., TPX RT31) as shown in Tables 6-1 and 6-2.

Comparative Example 4

A mold release film was created in the same manner as in Example 1 except that the base material layer was changed to a film (25 μm thick) produced using a polybutylene terephthalate elastomer resin (manufactured by DU PONT-TORAY CO., LTD., Hytrel 6347), and the thickness of the mold release layer was changed to 25 μm, as shown in Tables 6-1 and 6-2.

(4) Measurement and Evaluation

Using the obtained mold release film, the following measurement and evaluation were performed. Tables 6-1 and 6-2 show the results.

(a) and (b): Measurement was performed under the condition of a temperature rising rate of 2° C./minute and a load of 500 mN in the thermomechanical analysis (TMA) measurement using TMA7100 (manufactured by Hitachi High-Tech Corporation). From the TMA curve, the amount of dimensional change X1(%) in the length of the mold release film at 170° C., the amount of dimensional change X2(%) in the length of the mold release film at 190° C., the amount of dimensional change X3(%) in the length of the mold release film at 25° C., and the amount of dimensional change X4(%) in the length of the mold release film at 100° C. were obtained and applied to the following equations to calculate each of α1 and α1/α2.

$$(X2-X1)/(190-170)=\alpha1$$

$$(X4-X3)/(100-25)=\alpha2$$

Regarding the thermomechanical analysis (TMA) measurement, the measurement was performed using a thermomechanical analyzer (TMA7100 (manufactured by Hitachi High-Tech Corporation)) under the following measurement condition.

(Measurement Condition)

Temperature range: 0° C. to 250° C.

Temperature rising rate: 2° C./minute

Load: 500 mN

Test piece: 4 mm width×10 mm

Test mode: compression (c) Breaking elongation: the breaking elongation of the mold release film at 180° C. was measured according to JIS K 7127.

(i) Measurement of Surface Roughness Rz of Mold Release Surface of Mold Release Film Measurement was performed in accordance with JIS B 0601:2013.

(ii) Evaluation of External Appearance of Molded Body

First, tablets of the following granular thermosetting resin composition were produced as a resin for sealing.

(Materials)

Epoxy resin 1: biphenyl aralkyl type epoxy resin (manufactured by Nippon Kayaku Co., Ltd., NC-3000)

Epoxy resin 2: biphenyl type epoxy resin (manufactured by Mitsubishi Chemical Corporation, YL6677)

Curing agent 1: biphenylene skeleton-containing phenol aralkyl resin (manufactured by Nippon Kayaku Co., Ltd., GPH-65)

Curing agent 2: triphenylmethane type phenolic resin modified with formaldehyde (manufactured by AIR WATER INC., HE910-20)

Curing accelerator: triphenylphosphine (manufactured by HOKKO CHEMICAL INDUSTRY CO., LTD., TPP)

Inorganic filler: fused spherical silica (manufactured by Denki Kagaku Kogyo Co., Ltd., FB-950FC)

Coloring agent: carbon black (Mitsubishi Chemical Corporation, MA-600)

Coupling agent: N-phenyl-γ-aminopropyltrimethoxysilane (manufactured by Shin-Etsu Chemical Co., Ltd., KBM-573)

Mold release agent: carnauba wax (manufactured by Nikko Fine Co., Ltd., Nikko Carnauba)

(Procedure)

4.5 parts by mass of the epoxy resin 1, 4.5 parts by mass of the epoxy resin 2, 2.8 parts by mass of the curing agent 1, 2.8 parts by mass of the curing agent 2, 0.4 parts by mass of the curing accelerator, 84.2 parts by mass of the inorganic filler, 0.2 parts by mass of the coloring agent, 0.4 parts by mass of the coupling agent, and 0.2 parts by mass of the mold release agent, all of which were described above, were prepared. Next, after mixing each of the raw material components at room temperature using a mixer, the mixture was roll kneaded while being heated with two rolls at 45° C. and 90° C. to obtain a kneaded material. Next, the above-mentioned kneaded material was cooled and thereafter ground, and thereby a granular thermosetting resin composition was obtained.

Next, using each mold release film, curing (resin sealing) of the thermosetting resin composition was performed in the following procedure.

First, five 7.5-millimeter square semiconductor elements having a thickness of 0.3 mm were adhered on an organic substrate having a thickness of 0.4 mm, a width of 65 mm, and a length of 190 mm with a silver paste, and a gold wire having a diameter of 18 μm and a length of 7 mm was bonded with a pitch spacing of 60 μm. Next, the metal mold temperature of a compression molding machine (manufactured by TOWA CORPORATION, PMC1040) was preliminarily set to 175° C. Next, the organic substrate was fixed to an upper metal mold such that the surface on which the semiconductor elements were mounted faced a lower metal mold. Next, the mold release film created in each of the examples and comparative examples was disposed on the lower metal mold. Thereafter, the space inside the metal mold was evacuated, thereby causing the mold release film to follow the metal mold. Thereafter, the granular thermosetting resin composition (resin composition for sealing) prepared on the mold release film was uniformly supplied. Next, immediately after supplying the resin composition for sealing, the metal mold was clamped until the space between the organic substrate and the mold release film was 4 mm, and at the same time, the pressure inside the cavity formed because of the lower metal mold and the upper metal mold was reduced to a degree of pressure reduction of 0.8 Torr in 4 seconds. Thereafter, while continuing to reduce the pressure, the metal mold was completely clamped in 12 seconds to perform sealing molding under the condition of a molding pressure of 3.9 MPa and a curing time of 90 seconds.

(iii) Evaluation of Mold Release Film

[Mold Followability]

The amount of dead air spaces between the metal mold and the mold release film when the mold release film was caused to follow the metal mold by evacuation in the above-mentioned procedure was evaluated according to the following criteria.

⊙: no dead air spaces were generated.

○: there was a small amount of dead air spaces, which did not cause practical problems.

Δ: there was a small amount of dead air spaces, which lowered the degree of vacuum for film adsorption.

x: there was a large amount of dead air spaces, which made following poor (or made evaluation impossible).

[Dimensional Stability]

The external appearance state (wrinkles and the like) of the cured substance after releasing the cured substance from the mold release film after molding in the above-mentioned procedure was evaluated according to the following criteria.

○: there were no wrinkles or deformation, which caused no problems.

Δ: there were some wrinkles, which did not cause practical problems.

x: there was a large amount of wrinkles, which made molding poor.

[Mold Releasability]

The mold release behavior and the state of the cured substance (misalignment, bending, and the like) when the cured substance was released from the molded release film after molding in the above-mentioned procedure were evaluated according to the following criteria.

○: no problem in both mold releasing and the molded product.

Δ: the molded product was misaligned or bent when being released from the mold, which did not cause practical problems.

x: mold releasing was impossible, or the molded product was greatly misaligned or bent.

[Interlayer Strength]

The state of the mold release layer when the cured substance was released from the molded release film after molding in the above-mentioned procedure was evaluated according to the following criteria.

○: there was no peeling of the mold release layer, which caused no problems.

Δ: a part of the mold release layer came off from the base material layer, which did not cause practical problems.

x: large sections of the mold release layer were peeled off from the base material layer.

TABLE 6-1

| | | | Third experiment | | | | | | | |
|---|---|---|---|---|---|---|---|---|---|---|
| | | Unit | Example 1 | Example 2 | Example 3 | Example 4 | Example 5 | Example 6 | Example 7 | Example 8 |
| Base material layer | Material | | OPBT (1) | | | | | OPBT (2) | OPET (1) | |
| | Thickness | μm | | 15 | | | | 20 | 9 | 12 |
| Mold release layer | Material | | | | Composition (1) | | Composition (2) | | Composition (1) | |
| | Surface roughness Rz | μm | 0.1 | 6.3 | | | 0.1 | | | |
| | Thickness | μm | 3.5 | | 10 | 70 | 35 | 30 | 41 | 38 |
| Mold release film | (a) Amount of dimensional change X1 at 170° C. | % | 8.9 | 6.2 | 8.6 | 4.7 | 5.8 | 7.7 | 7.1 | 3.6 |
| | Amount of dimensional change X2 at 190° C. | % | 16 | 16 | 25 | 9.2 | 15 | 18 | 10 | 5.7 |
| | $\alpha 1 = (X2 - X1)/(190 - 170)$ | | 0.36 | 0.49 | 0.82 | 0.23 | 0.46 | 0.52 | 0.15 | 0.11 |
| | (b) Amount of dimensional change X3 at 25° C. | % | 0.07 | 0.07 | 0.15 | 0.009 | 0.05 | 0.04 | 0.01 | 0.01 |
| | Amount of dimensional change X4 at 100° C. | % | 1.5 | 1.5 | 3.3 | 2 | 2.0 | 2.4 | 1.3 | 1.1 |
| | $\alpha 2 = (X4 - X3)/(100 - 25)$ | | 0.02 | 0.02 | 0.04 | 0.03 | 0.03 | 0.03 | 0.02 | 0.01 |
| | $\alpha 1/\alpha 2$ | | 19 | 26 | 20 | 8 | 18 | 16 | 8 | 7 |

TABLE 6-1-continued

| Third experiment | | | | | | | | | | |
|---|---|---|---|---|---|---|---|---|---|---|
| | | Unit | Example 1 | Example 2 | Example 3 | Example 4 | Example 5 | Example 6 | Example 7 | Example 8 |
| | (c) Breaking elongation at 180° C. | % | 167 | 167 | 123 | 251 | 191 | 188 | 103 | 125 |
| Evaluation | Mold followability | | ⊙ | ⊙ | ⊙ | ⊙ | ⊙ | ○ | ○ | Δ |
| | Dimensional stability | | ○ | ○ | ○ | ○ | ○ | ○ | ○ | ○ |
| | Mold releasability | | ○ | ○ | ○ | ○ | ○ | ○ | ○ | ○ |
| | Interlayer strength | | ○ | ○ | ○ | ○ | ○ | ○ | ○ | ○ |

TABLE 6-2

| Third experiment | | | | | | | |
|---|---|---|---|---|---|---|---|
| | | Unit | Example 9 | Comparative Example 1 | Comparative Example 2 | Comparative Example 3 | Comparative Example 4 |
| Base material layer | Material | | OPET (2) | OPBT (1) | OPET (1) | TPX | PBT |
| | Thickness | μm | 13 | 15 | 19 | 35 | 25 |
| Mold release layer | Material | | Composition (1) | Composition (3) | | Composition (1) | |
| | Surface roughness Rz | μm | 0.1 | | | 0.1 | |
| | Thickness | μm | 37 | 35 | 31 | 15 | 25 |
| Mold release film | (a) Amount of dimensional change X1 at 170° C. | % | 12 | 13 | 2.3 | >55 | 9.5 |
| | Amount of dimensional change X2 at 190° C. | % | 30 | 41 | 3.2 | >55 | .54 |
| | α1 = (X2 − X1)/(190 − 170) | | 0.90 | 1.4 | 0.05 | — | 2.2 |
| | (b) Amount of dimensional change X3 at 25 °C | % | 0.009 | 0.37 | 0.005 | 0.49 | 0.06 |
| | Amount of dimensional change X4 at 100° C. | % | 2.9 | 2.9 | 0.9 | 11 | 3.2 |
| | α2 = (X4 − X3)/(100 − 25) | | 0.04 | 0.03 | 0.01 | 0.14 | 0.04 |
| | α1/α2 | | 23 | 42 | 4 | — | 53 |
| | (c) Breaking elongation at 180° C. | % | 143 | 279 | 156 | 886 | 545 |
| Evaluation | Mold followability | | ⊙ | ⊙ | X | ⊙ | ⊙ |
| | Dimensional stability | | ○ | ○ | X | X | X |
| | Mold releasability | | ○ | ○ | Δ | Δ | Δ |
| | Interlayer strength | | ○ | ○ | ○ | X | ○ |

This application claims priority on the basis of Japanese Patent Application No. 2021-004017 filed Jan. 14, 2021, Japanese Patent Application No. 2021-004041 filed Jan. 14, 2021, and Japanese Patent Application No. 2021-090120 filed May 28, 2021, and all of its disclosures are incorporated herein by reference.

REFERENCE SIGNS LIST

1 mold release layer
2 second base material layer
3 first base material layer
10 mold release film
11 mold release surface
21 mold release surface
201 mold release layer
202 base material layer
203 mold release surface
211 mold release film
301 mold release layer
302 base material layer
303 mold release surface
311 mold release film

The invention claimed is:

1. A mold release film which has a multilayer structure in which a mold release layer, a first base material layer, and a second base material layer are laminated in this order, wherein the mold release layer constitutes a mold release surface of the mold release film, and the second base material layer constitutes a surface of the mold release film on an opposite side of the mold release surface, wherein the mold release layer contains one or two or more selected from a silicone resin, a fluororesin, a melamine resin, an epoxy resin, a phenolic resin, and an acrylic resin, the mold release layer formed by dissolving said one or two or more followed by coating, wherein the first base material layer is formed by a stretched or un-stretched film containing one or two or more selected from a polyester resin, a polyolefin resin, and a polyamide resin, and wherein the second base material layer is formed by a stretched or un-stretched film containing one or two or more selected from a polyester resin, a polyolefin resin, and a polyamide resin, wherein a storage elastic modulus of the mold release film is 10 to 500 MPa at 180° C. when a dynamic viscoelasticity (DMA) is measured under a condition of a temperature rising rate of 5° C./minute and a frequency of 1 Hz.

2. The mold release film according to claim 1, wherein a value of the mold release film measured by a loop stiffness test is equal to or more than 2 mN/cm.

3. The mold release film according to claim 1, wherein a rate of dimensional change of the mold release film is 4% to 40% at 180° C. when a temperature is raised from 30° C. to 180° C. at 2° C./minute with a tensile load of 500 mN according to a thermomechanical analysis (TMA).

4. The mold release film according to claim 1, wherein a surface roughness Ra of the surface of the mold release layer of the mold release film is 0.3 to 2 μm.

5. The mold release film according to claim 1, wherein a surface roughness Ra of the surface of the mold release layer of the mold release film is less than 0.2 μm.

6. The mold release film according to claim 1, wherein a total thickness of the first base material layer and the second base material layer is 25 to 70 μm.

7. The mold release film according to claim 1, wherein in a sealing resin molding process for a resin-sealed semiconductor device in which a semiconductor device is resin-sealed, the mold release film is provided and used by being disposed between a mold and the semiconductor device.

* * * * *